(12) United States Patent
Chou et al.

(10) Patent No.: US 6,291,254 B1
(45) Date of Patent: Sep. 18, 2001

(54) METHODS FOR DETERMINING ON-CHIP INTERCONNECT PROCESS PARAMETERS

(75) Inventors: Shih-tsun Alexander Chou, Sunnyvale; Keh-Jeng Chang, San Jose; Robert G. Mathews, Los Altos, all of CA (US)

(73) Assignee: Sequence Design, Inc., San Jose, CA (US)

( * ) Notice: Subject to any disclaimer, the term of this patent is extended or adjusted under 35 U.S.C. 154(b) by 0 days.

(21) Appl. No.: 09/244,616

(22) Filed: Feb. 4, 1999

Related U.S. Application Data

(62) Division of application No. 08/937,393, filed on Sep. 25, 1997.

(51) Int. Cl.[7] .................................................. G01L 21/66
(52) U.S. Cl. .............................. 438/18; 438/52; 257/14; 257/77.3
(58) Field of Search .................. 438/14, 15, 18, 438/52; 257/773, 14; 324/14

(56) References Cited

U.S. PATENT DOCUMENTS

| | | |
|---|---|---|
| 3,335,340 | 8/1967 | Barson et al. |
| 4,516,071 | 5/1985 | Buehler .................. 324/158 |
| 5,561,373 | 10/1996 | Itoh ....................... 324/158.1 |
| 5,719,495 * | 2/1998 | Moslehi ................. 324/158.1 |
| 5,793,471 * | 8/1998 | Kanda ..................... 355/53 |
| 5,883,437 * | 3/1999 | Maryama ................ 257/773 |

FOREIGN PATENT DOCUMENTS

| | | | |
|---|---|---|---|
| 09 186213 | 7/1997 | (JP) | H01L/21/66 |
| 09 246269 | 9/1997 | (JP) | H01L/21/3205 |

OTHER PUBLICATIONS

M. G. Buehler et al.: "Role of Test Chips in Coordinating Logic and Circuit Design and Layout Aids for VLSI," Solid State Technology, Sep. 1981, pp. 68–71, XP002086866.

A. Srivastava: "Test Device Structures for Integrated Circuit Design, Process Technology Development and Evaluation" Microelectronics and Reliability., vol. 22, No. 2, 1982, pp. 195–206, XP00208867.

* cited by examiner

*Primary Examiner*—John F. Niebling
*Assistant Examiner*—Andre Stevenson
(74) *Attorney, Agent, or Firm*—Skjerven Morrill Macpherson; Edward C. Kwok, Esq.

(57) ABSTRACT

A method provides estimations of physical interconnect process parameter values in a process for manufacturing integrated circuits. The method includes fabricating test structures each providing a value of a measurable quantity corresponding to a value within a range of values of the physical interconnect process parameters. In some embodiments, the measured value is used to derive the values of the physical interconnect process parameters, either by a numerical method using a field solver, or by a closed-form solution. The values of physical interconnect process parameters involving physical dimensions are also obtained by measuring photomicrographs obtained using a scanning electron microscope from cross sections of test structures. In some embodiments, a family of test structures corresponding to a range of conductor widths and a range of spacings between conductors are measured.

19 Claims, 12 Drawing Sheets

METHODS FOR DETERMINING ON-CHIP INTERCONNECT PROCESS PARAMETERS

Cross-reference to Related Applications

The present application is a divisional application of U.S. patent application, Ser. No. 08/937,393, filed Sep. 25, 1997, entitled "Methods for Determining On-Chip Interconnect Process Parameters," assigned to Frequency Technology, Inc., which is also the Assignee of the present Application.

BACKGROUND OF THE INVENTION

1. Field of the Invention

The present invention relates to integrated circuit manufacturing. In particular, the present invention relates to determining values of interconnect process parameters for use in an integrated circuit design to ensure manufacturability and performance.

2. Discussion of the Related Art

Interconnect process parameters are parameters include physical dimensions and coefficients of conducting and insulating properties. Typical interconnect process parameters used in designing integrated circuits include thicknesses, widths, and such material properties as sheet resistances of conducting layers (e.g., polysilicon and metal) and permittivities of intervening insulator layers (e.g., silicon dioxides). From measurements of these interconnect process parameters, the electrical properties of conductive traces of an integrated circuit can be individually modeled as resistances, capacitances, and inductances. The resistances, capacitances and inductances can be obtained numerically for any structure manufactured under a including programs commonly referred to as "field solvers".

A field solver is a computer program which calculates a distribution of an electric field, based on solving the Poisson's equation numerically in two or three dimensions. Thus, a field solver can be used to calculate interconnect electrical properties (e.g., resistances and capacitances) based on a physical model of an interconnect structure. One such field solver, named "Raphael™", is available from Technology Modeling Associates, Sunnyvale, Calif. Alternatively, the "QuickCap™" program available from Random Logic Corporation, Fairfax, Va., while strictly speaking not a field solver, can also be used.

In the prior art, field solvers did not play a direct role in determining values of interconnect process parameters. Instead, values of interconnect process parameters are derived from measurements using structures to designed to allow the values of the interconnect process parameters to be computed using closed-form formulae. Typically, a field solver is used only to check whether the values of these interconnect process parameters obtained from these close-formed formulae correctly predict the electrical properties of structures.

Because the interconnect structures in an integrated circuit design below the half-micron level typically contribute a substantial portion of the signal propagation delays, variations in these interconnect structures can result in significant variations in the electrical properties of the interconnect, and thus significant variations in circuit performance. Thus, interconnect process parameters must be accurately extracted. Alternatively, the physical dimensions of interconnect structures are obtained primarily by measuring, for example, scanning-electron microscope (SEM) micrographs of one or more cross-sections of a fabricated test structure. However, poor instrument calibrations can limit the accuracy of such measurements.

In the prior art, when interconnect structures account for a much smaller portion of the electrical properties of the integrated circuit, interconnect process parameters are measured by process engineers for process monitoring purposes, rather than for obtaining accurate measurements of the electrical properties under various load conditions. Consequently, AC and DC electrical measurements are performed on relatively simple test structures (e.g., the van der Pauw structure can be used to measure conductor and diffusion sheet resistances. Similarly, a parallel-plate capacitor can be used to measure capacitance per unit area). Typically, however, these measurements are used to determine directly the capacitance associated with a particular structure, not to determine values of the underlying interconnect process parameters. For example, a parallel-plate structure can be used to determine the capacitance per unit area of a conductor plate. As another example, a conductor line can be provided over a conductor plate. The capacitance per unit length of the conductor line can be determined from such a structure. However, such simple test structures are unsuitable for modeling local variation effects of electrically conductive traces.

Examples of a resistance measurement and a sheet resistivity measurement are provided here. FIG. 6 shows schematically a four-point Kelvin technique in the prior art for measuring the resistance value of a device 6000 (e.g., a resistor) in an integrated circuit. In FIG. 6, device 6000 is connected to four terminals (pads) 600–6004. According to the four-point Kelvin technique, a current I is forced through device 6000 via terminals 6001 and 6002, resulting in a voltage difference V1–V2 across device 6000. The voltage difference is measured across the other two terminals 6003 and 6004. The resistance R of device 6000 is provided by:

$$R=(V1-V2)/I.$$

Sheet resistance $\rho$ is a convenient measure of resistivity of a conducting layer. In the prior art, to measure resistivity, one form of the four-point Kelvin structure, known as a van der Pauw structure can be used. A van der Pauw structure 800 is shown in FIG. 8. As shown in FIG. 8, test structure 800 includes probe pads 801–804, and a cross-shaped structure 805, which is formed by conductor traces 805$a$, 805$b$, 805$c$ and 805$d$ in the conductor layer for which sheet resistance is to be determined. Conductor traces 805$a$–805$d$ intersect at a square portion 805$e$. The resistance of square portion 805$e$ is used to determine the sheet resistance of interest. As in the resistance measurement discussed above, a current I is forced across probe pads 804 and 803 in test structure 800, and a voltage difference $\Delta V=V2-V1$ is measured across probe pads 801 and 802. In test structure 800. the sheet resistance $\rho$ is given by the relation:

$$\rho=\pi/\ln(2)*\Delta V/I$$

However, van der Pauw structures are difficult to use in highly conductive layers, such as aluminum. In highly conductive layers, resistivity $\rho$ is small. Consequently, the sheet resistance of a square of conductor having this resistivity is also low. As a result, a high current I through the test structure is required to create a measurable voltage difference $\Delta V$. Such a large current can cause a heating effect that affects measurement accuracy and, in some instances, can destroy the test structure.

"Micro-loading" is an effect caused by the local density of conductors within the same conductive layer on each other. Micro-loading, which can result in non-uniformity in conductor widths, occurs in an area of low local conductor density where the etchant is locally depleted due to removal of a large amount of material. Micro-loading results in an under-etching of the conductive layer, i.e., the resulting conductor widths are wider than desired. Conversely, in an area of high local conductor density, an excessive amount of active etchant can remain when only a small amount of conductive material is to be removed. The excess amount of active etchant results in an over-etching of the conductive layer, i.e., resulting conductor widths are narrower than desired.

The non-uniformity resulting from micro-loading, or other mechanisms leading to an under-etch or an over-etch of a conductor, can be characterized by an interconnect process parameter "CD loss." CD loss affects the electrical characteristics (e.g., a resistance or a capacitance) of a conductor. Thus, CD loss is an important design parameter. Test structures such as test structure 800, or similar structures with a square or nearly-square central region, are often used because of relative insensitivity to CD loss. In test structure 800, for example, the square central region 805e maintains a constant aspect ratio of 1:1 despite CD loss, i.e., its width and length are equally reduced by critical dimension loss. Typically, CD losses are in the order of 0.1 micron for a 0.35-micron process.

CD loss can be determined using a conductor trace of a drawn width W, and same-layer parallel conductor traces of the same width W, spaced a distance of S length units apart. Such a test structure 1100 is shown in FIG. 11. In FIG. 11, test structure 1100 is a four-point Kelvin structure which includes portion 11101 of a length L and a width W. Portion 11101 is surrounded by a large number of pairs of neighboring conductor traces which are labeled 11102a, 11102b . . . , placed at spacing S apart. To illustrate, for a 0.35 um technology, Kelvin structure 1100, together with neighboring wires 11102a, 11102b, . . . span a distance of about 40 um on each side (i.e., 30 to 40 neighboring traces on each side). The line-width correction $\Delta W$ associated with the CD loss for W and S is provided by the equation:

$$\Delta W = W - (L*\rho/R)$$

where $\rho$ is the sheet resistivity of the conductor layer.

In the prior art, circuit behaviors (e.g., speed) are not as critically affected by the detailed interconnect structure. Therefore, a test structure for monitoring CD loss typically consists of conductor lines of a single width, provided either at minimal or very large spacings. Thus, the prior art only illuminates how to determine critical dimensions in isolated situations, but provides no general means for characterizing CD loss systematically for the full range of interesting situations.

Another mechanism that brings about non-uniformity is the "proximity effect." For example, planarization techniques using chemical-mechanical polishing techniques can yield thicknesses that vary systematically according to the local conductor density in the conductor layer underlying the interlayer dielectric (ILD) layer. This systematic variation (the "proximity effect") causes a greater interlayer dielectric thickness in a region of higher underlying conductor density than a region of lower conductor density. In addition to the proximity effect, interconnect structures outside a region can also affect uniformity in ILD thicknesses within a region. A non-uniform ILD thickness can affect electrical properties profoundly.

In the prior art, an ILD thickness can be obtained by measuring the capacitance C of a parallel-plate test structure, such as test structure 650 shown in FIG. 2. Test structure 650 is used to determine the ILD thickness above a conductor plate 602 of conductor layer L2. To measure capacitance C, conductor plate 603 of layer L3, and any structures above conductor layer L3, are connect to one probe pad 604 to form a first electrode, and conductor plate 602 of conductor layer L2, and any other conductor structures below conductor layer L2, are connected to another probe pad 605 to form a second electrode. The ILD thickness $h_{L2-L3}$ between conductor layers L2 and L3 is the calculated using the equation:

$$C = \epsilon_0 * A / (h_{L1-L2}/k_{L2-L3})$$

where C is the measured capacitance, the $k_{L2-L3}$ is the associated interlayer dielectric permittivity, $\epsilon_0$ is the permittivity of free space, and A is the surface area of test structure 650 (as viewed from the top).

SUMMARY OF THE INVENTION

The present invention provides a method for measuring the full range of values for an interconnect process parameter (e.g., a line-width correction, an interlayer dielectric thickness, or a permittivity of an intralayer dielectric) under a given semiconductor manufacturing process, using a family of test structures. This method of the present invention includes the two steps. First, a family of test structures are fabricated using the manufacturing process. In this family of test structures, each test structure differs from another test structure of the family in the value of an interconnect design parameter, and the test structure is designed to provide a measurable quantity corresponding to a value of the interconnect process parameter to be determined. In the second step, each the measurable quantity is measured in the test structure. The desired value of the interconnect process parameter can then be derived from the measured value of the measurable quantity. In some instances, the measurable quantity is an electrical property, such a resistance, a capacitance or an inductance. In other instances, the measurable quantity is physical dimension which can be provided by, for example, a measurement using a SEM photomicrograph.

In one embodiment, the interconnect design parameters that are varied in the family of test structures are conductor widths, conductor spacing and the number of neighboring conductors in the proximity of a selected conductor.

In one embodiment, the interconnect process parameter is obtained using a field solver. In that embodiment, the field solver predicts the measured value of the measurable quantity, as the value of the interconnect process parameter is successively approximated. The desired value of the interconnect process parameter is achieved when the measured value of the interconnect process parameter substantially equals the approximated value.

In accordance with another aspect of the present invention, a method for determining a sheet resistance of an interconnect layer is provided. Under this method, a test structure which incorporates a resistive portion is fabricated. In that test structure, the resistive portion has an effective length which is substantially greater than the effective width. At the same time, the effective width of the resistive portion is substantially greater than a predetermined minimum conductor width for use in that manufacturing process. Under this configuration, the test structure is relatively insensitive to CD loss, while at the same time allowing accurate electrical measurement of the conductor layer's sheet resistivity without causing excessive heating, as is prone in the prior art.

In accordance with another aspect of the present invention, a method provides a built-in reference ruler for measuring lateral dimensions in a photomicrograph, such as a SEM photomicrograph. This method includes the steps of: (i) including in a design of a test structure parallel lines of a material spaced apart by a known pitch; (ii) fabricating the test structure in a manufacturing process; (iii) preparing a cross section of the test structure, such that the cross section includes a cross section of the parallel lines; (iv) taking a photomicrograph of the cross section of the test structure; and (v) measuring features in the photomicrograph using the known pitch and the image of the cross section of the parallel lines in the SEM photomicrograph as a ruler for measuring the lateral dimensions.

The built-in reference ruler can also be used under another method of the present invention to calibrate a dimension orthogonal to the lateral dimensions. In this method, two photomicrographs are taken of the cross section of the test structure, each photomicrograph depicting the test structure in one of two orthogonal orientations. The known pitch and the dimensions of the cross sections of the parallel conductors in one photomicrograph is used to calibrate the dimension along an orthogonal orientation in the other photomicrograph.

In accordance with another aspect of the present invention, a method allows determining a value of an interconnect process parameter relating to conductor lines of an interconnect process. In that method, each conductor line has non-rectangular dimensions characterized by more than one dimensional parameters. The method of the present invention includes (a) determining the values of the dimensional parameters using one or more physical measurements; and (b) determining a value for an interconnect process parameter using a field solver. In determining the value of the interconnect process parameter, the field solver includes in its physical model the values of the plurality of dimensional parameters. In some embodiments, the conductors have trapezoidal cross sections. In other embodiments, the conductors consists of multiple layers (e.g. an aluminum core and one or more capping layer, such a titanium nitride capping layer).

In accordance with another aspect of the present invention, a method is provided for determining a global effect of a conductor pattern within a given region on an interconnect process parameter within and outside the given region. Under this method, the conductor pattern and a number of test structures are fabricated on a substrate. On the substrate, the conductor pattern is provided in the given region, and the test structures are distributed both within the given region and outside the given region. In one embodiment, each of the test structures are adapted to measure a value of a local dielectric thickness. In that embodiment, the conductor pattern includes an array of conductors each having a given width and each being spaced a predetermined distance from each other. In that embodiment, the local dielectric thickness is measured either electrically or through an SEM technique on a cross section. The test structures can be placed along an axis of the substrate.

The present invention is better understood upon consideration of the detailed description below and the accompanying drawings.

DETAILED DESCRIPTION OF THE PREFERRED EMBODIMENTS

Figure 1:
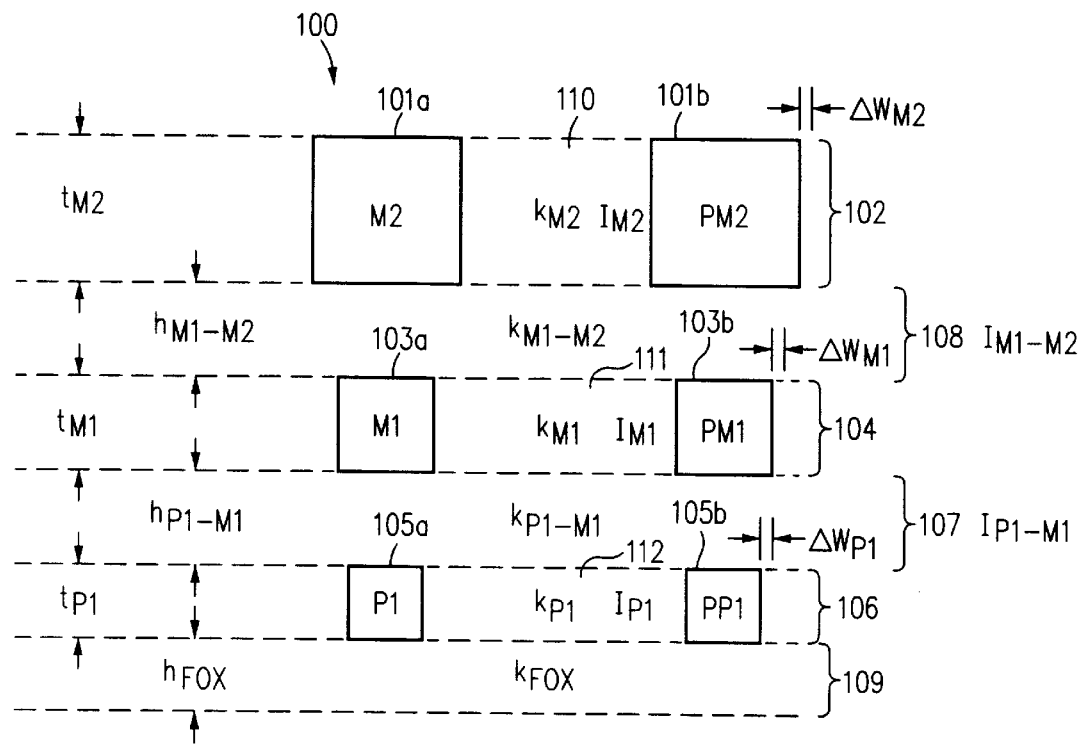
FIG. 1 illustrates the interconnect process parameters measured in the present invention using a representative fabrication process which includes as conductors two levels of metallization and a one level of polysilicon.

FIG. 1 illustrates the interconnect process parameters measured in the present invention using a representative fabrication process that includes as conductors two levels of metallization and one level of polysilicon. Of course, the present invention is not limited by the number of layers of conductors or the nature of the conductor or dielectric materials.

As shown in FIG. 1, the cross-sectional view of an idealized interconnect structure 100 includes metal traces 101a and 101b in metal layer 102 (M2), metal traces 103a and 103b in metal layer 104 (M1), and polysilicon traces 105a and 105b in polysilicon layer 106 (P1). Each metal trace in metal layer 102 (e.g., either one of metal traces 101a and 101b) has a thickness $t_{M2}$. Likewise, each metal trace in M1 layer 104 (e.g., either one of metal traces 103a and 103b), and each polysilicon trace in Pi layer 106 (e.g. either one of polysilicon traces 105a and 105b) have thicknesses $t_{M1}$ and $t_{P1}$ respectively.

Between polysilicon layer 106 and metal layer 104 and between metal layer 104 and metal layer 102 are interlayer dielectric (ILD) layers 107 and 108, designated $I_{P1-M1}$ and $I_{M1-M2}$, respectively. $I_{P1-M1}$ and $I_{M1-M2}$ have thicknesses $h_{P1-M1}$ and $h_{M1-M2}$ respectively. In addition, the spaces between conductors of metal layer 102 (e.g. conductors 101a and 101b) are filled by intralayer dielectric 110, designated $I_{M2}$. Similarly, the spaces between conductors of metal layer 104 (e.g., conductors 103a and 103b) and between conductors of polysilicon layer 106 (e.g., conductors 105a and 105b) a are filled by intralayer dielectric layers 111 and 112, designated $I_{M1}$ and $I_{P1}$, respectively. Intralayer dielectric 110, 111 and 112 have thicknesses $t_{M2}$, $t_{M1}$ and $t_{P1}$ respectively Because of processing imperfections, the final dimensions of metal traces in M1 layer 104 and M2 layer 102 and polysilicon traces in P1 layer 106 may differ from their design or "drawn" widths. The differences between actual and design widths are characterized by line-width correction factors $\Delta W_{M1}$, $\Delta W_{M2}$ and $\Delta W_{P1}$ respectively. Since the actual or fabricated widths are usually narrower than the drawn widths, the line-width correction factors shown in the drawing usually have positive values. Process engineers often refer to this loss of line-width as the "critical dimension loss," or the "CD loss."

Each conductor layer is characterized by a sheet resistance. For example, conductor layers 102, 104 and 106 of FIG. 1 are each characterized by sheet resistances $\rho_{M2}$, $\rho_{M1}$ and $\rho_{P1}$, respectively. Similarly, each dielectric layer is characterized by a permittivity. Thus, intralayer dielectric 110, 111 and 112 are characterized by their respective permittivities $k_{M2}$, $k_{M1}$ and $k_{P1}$ and interlayer dielectric layers 108, 107 and 109 are characterized by their respective permittivities $k_{M1-M2}$, $k_{P1-M1}$ and $K_{FOX}$. (In FIG. 1, the lowest interconnect conductor layer, i.e., polysilicon layer 106, is shown fabricated on a field oxide layer 109, which has a permittivity $k_{FOX}$ and a thickness $h_{FOX}$.)

The line-width correction factors, the thicknesses, the sheet resistances, and the permittivities of FIG. 1 are some of the interconnect process parameters measured in accordance with the present invention.

FIG. 1 shows conductor traces and intralayer dielectrics as having rectangular cross-sections, and interlayer dielectrics as having uniform thicknesses. In cross-section, the interconnect structures resemble a brick wall composed of many kinds of rectangular "bricks." Generally, this "brick wall" model approximates actual typical interconnect structures sufficiently well to allow relatively accurate prediction of electrical characteristics. Accordingly, in the discussions of interconnect structures, this detailed description generally assumes this idealized brick wall model. Nevertheless, structures in some processes can possess significantly non-rectangular cross-sections. The present invention, as described below, provides also a method for determining interconnect process parameters when the interconnect structures exhibit cross-sections deviating from those of the idealized brick wall model.

The present invention provides a method for obtaining values of the interconnect process parameters which characterize interconnect structures under an interconnect model. The interconnect model matches the fabricated interconnect structures sufficiently closely to allow field solvers or other tools to accurately predict the electrical properties of these fabricated interconnect structures. To achieve such an interconnect model, it is not necessary to mimic every detail of the physical interconnect. For example, if an intralayer dielectric layer consists of two sub-layers of different materials, the intralayer dielectric layer need only be modeled as a single layer for most purposes. To provide the requisite accuracy for predicting capacitance, however, the permittivity is provided as a function of conductor spacing.

The idealized interconnect model of FIG. 1 provides a single value to characterize each line-width correction and interlayer dielectric thickness. In actually fabricated structures, however, both of these interconnect process parameter values may vary systematically. For example, local configurations of the interconnect structures may result in systematic non-uniformity across the wafer. The present invention provides methods, which are described below, to fully characterize the systematic variation of these interconnect process parameters. In particular, the present invention provides a line-width correction factor to apply to a conductor trace as a function of the widths and spacings of same-layer neighboring traces, and the density of neighboring conductor traces within a relevant distance. The present invention also provides a method for fully characterizing ILD thicknesses, taking into consideration proximity effects and other processing artifacts.

Using a Field Solver to Determine Interconnect Parameters

Figure 3:
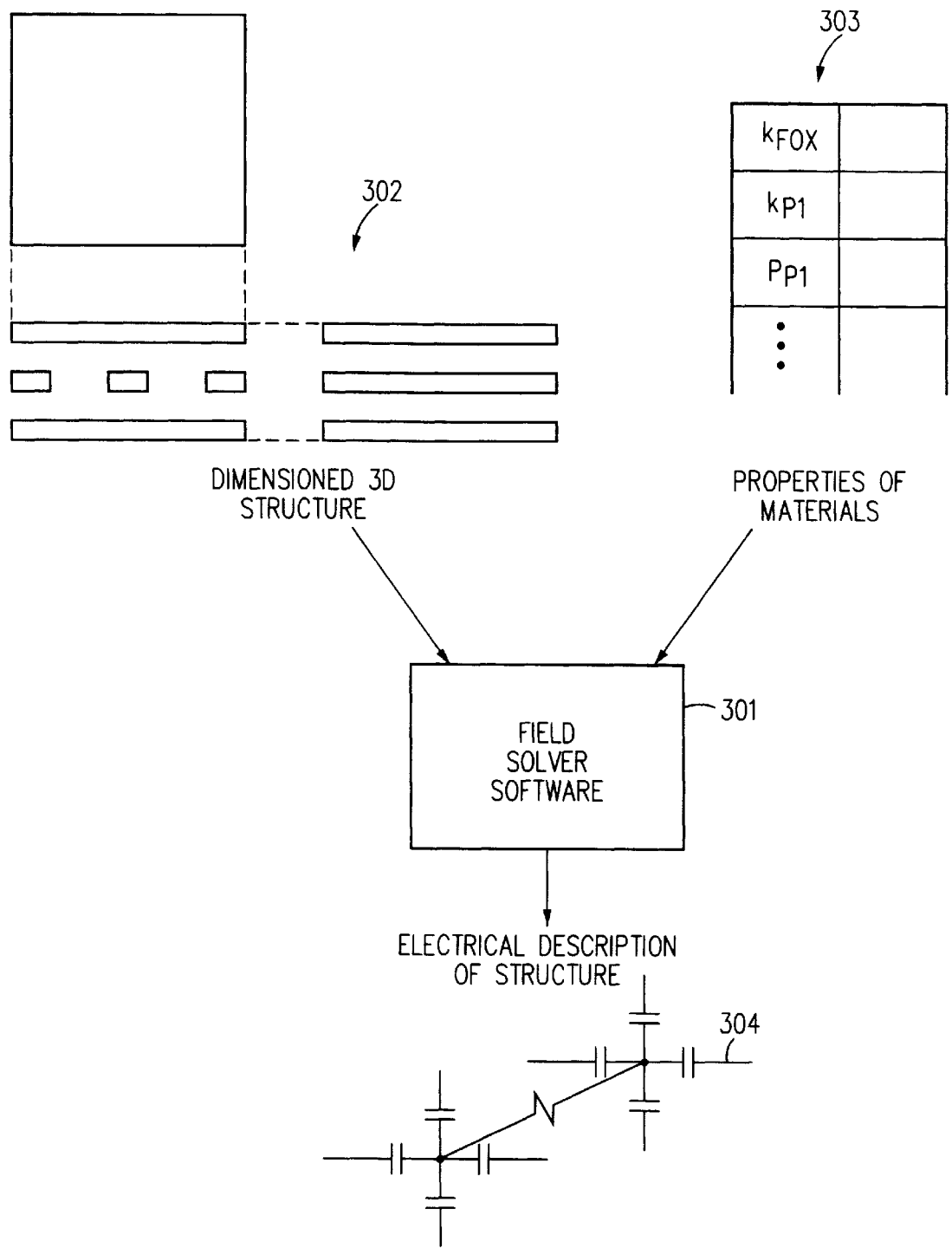
FIG. 3 illustrates the use of a field solver in calculating the interconnect process parameters of the present invention.

The present invention makes extensive use of field solvers. FIG. 3 illustrates the role of a field solver 301. Given a description of a physical structure of interconnect (e.g., its dimensions 302 and the related materials properties 303), a field solver can compute the structure's electrical properties relying only on basic physical laws. For example, a field solver can compute the capacitance between conductors in an interconnect structure given physical dimensions and dielectric constants. Unlike the prior art, however, under the present invention, field solvers play a direct role in determining the values of interconnect process parameters. In particular, the present invention provides a method using a field solver to extract the values of an interconnect process parameter. Typically, under the present invention, a suitable test structure is fabricated, which is designed to have a measurable electrical property (e.g., capacitance) which depends upon the value of the interconnect process parameter of interest. Typically also, a closed-form solution providing the value of the interconnect process parameter of interest does not exist. Starting from an estimated value for the interconnect process parameter of interest, and keeping the values of any other interconnect process parameters constant, the field solver reiterates until a converged value of the interconnect process parameter of interest is obtained.

For example, given an actually measured capacitance, resistance, or inductance of a test structure, the interconnect process parameter can be obtained by successive approximation. In particular, successively refined approximations of the interconnect process parameter of interest are fed into a field solver until the field solver predicts, within predetermined tolerance limits, the measured capacitance. The current approximation of the interconnect process parameter when the predicted value converges to the measured value is the desired value for the interconnect process parameter. Convergence can be achieved using well-known numerical methods, such as the binary search or Newton-Raphson iteration.

Alternatively, instead of using an iterative technique such as described above, a table can be provided which summarizes the electrical properties predicted by the field solver as a function of the interconnect parameter, provided over an appropriate range of values. An approximation to the interconnect process parameter can be interpolated or extrapolated from the table using the measured electrical properties from the test structure. The interpolated or extrapolated value may give a sufficiently accurate answer itself, or it may serve as a good initial estimate for the successive-approximation technique used in conjunction with a field solver, as described above. Using the table method reduces both the number of field solver runs necessary to find an acceptably accurate answer and the overall time to measure a set of test structures. Since the table can be compiled from the field solver runs prior to actual physical measurement, the turnaround time from receiving the measured data to completing the parameter calculations can be considerably shorter than the successive-approximation method described above.

Typically the interconnect process parameters can be determined one at a time. However, the same technique clearly can be generalized within the scope of the present invention to permit determining two or more interconnect process parameters at once, based on a corresponding number of suitable electrical measurements, using well-known numerical methods.

Test Structures for Determining Interconnect Process Parameters

Since the test structures are typically fabricated on a production wafer along side valuable integrated circuits, the test structures are designed to be minimally intrusive and to occupy no more than the necessary amount of silicon area. Thus, the test structures are minimized subject to two primary constraints: (a) the test structure should be large enough so that appropriate physical characteristics (e.g., interlayer thickness, critical-dimension loss, proximity effect) dominate the capacitances and resistances to be measured; and (b) the measured capacitance and resistance values should be large enough to be measured by routinely available equipment. For example, to measure parallel-plate capacitance in a 0.35 $\mu$m feature size process, a fabricated test structure occupying an area 300 $\mu$m on a side ensures that edge effects do not dominate the capacitance to be measured and provides an easily measurable capacitance of a few pico-farads. In some instances, active circuitry could be used to relax condition (b).

Figure 4:
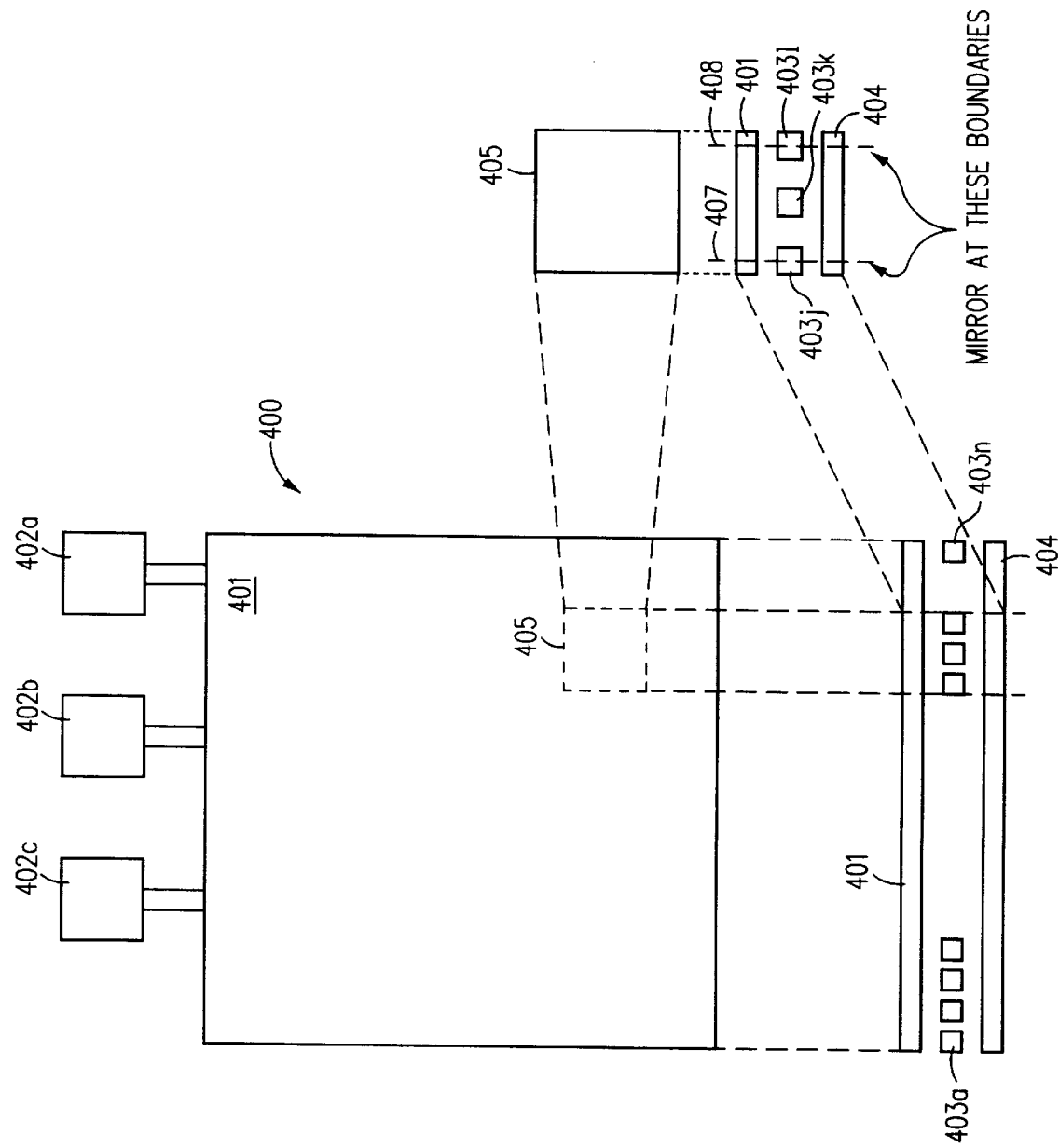
FIG. 4 shows one type of a test structure 400 used in the present invention, illustrating a relation between a test structure and a field solver.

FIG. 4 shows a generalized design of one type of test structure 400 useful in the present invention. In FIG. 4, a test structure 400, shown in top and cross-sectional views, includes a upper conductor layer 401, a lower conductor layer 404, and numerous conductor traces ("fingers") 403a–403n in a conductor layer 403. Conductor traces 403a–403n are electrically shorted to each other by an orthogonally running conductor trace (not shown), forming a comb structure. Conductor traces 403a–403n run in conductor layer 403, which is located between conductor layers 401 and 404. Probe pads 402a, 402b and 402c, which are connected to layers 401, 403 and 404 respectively, allow access to these conductor layers for electrical measurements. Conductor traces 403a–403n are fabricated in a large number to satisfy conditions (a) and (b) just discussed.

Figure 5:
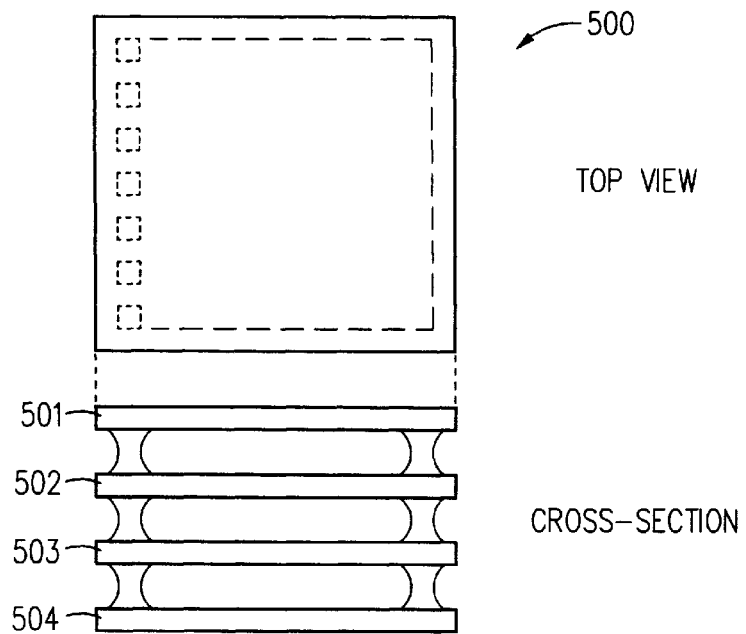
FIG. 5 shows in top and cross-sectional views the structure of probe pad 500, which is used for electrical access to one or more conductor layers of a test structure.
Figure 6:
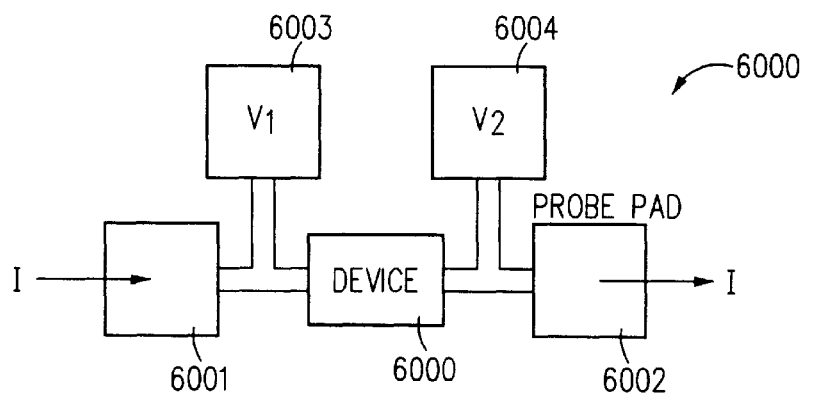
FIG. 6 shows a four-point Kelvin structure 600 of the prior art for measuring resistance of a device 6000.

FIG. 5 shows, in top and cross-sectional views, the structure of a probe pad 500 for electrical access to a conductor layer of a test structure. Probe pad 500, for example, can be used to perform the functions of probe pads 402a–402c of FIG. 4. As shown in FIG. 5, probe pad 500 includes conductor plates 501–504, for a corresponding number of conducting layers. Each of conductor plates 501–504 connects with a neighboring conductor plate through a large number of vias located around the periphery of the conductor plate. Probe pad 500 then connects to portions of the test structures through interconnect wiring to the appropriate layers.

Where the connection between a probe pad and a test structure affects measurement, a dummy structure consisting only of the probe pad and its interconnect conductors are provided. The capacitance of the dummy structure can then be subtracted from the measured value to give the capacitance of the test structure.

Where a field solver is used to predict the electrical properties of a test structure, it is some time necessary to extrapolate the electrical property of interest from one or a few small, representative, and repetitive elements of the test structure. For example, the electrical properties of the test structure 400 can be extrapolated from representative unit 405 of the test structure. As shown in FIG. 4, representative unit 405 includes a section of upper conductor 401, a section of lower conductor 404 and three conductor traces in layer 403, indicated by reference numerals 403j–403l. The field solution for representative unit 405 is mirrored at the indicated boundaries of 407 and 408 of element 405, so as to mimic repetitions of representative unit 405. The potentials in the upper and lower conductors 401 and 402, and conductor traces 403j–403l of conductor layer 403 are assigned the same potentials under which capacitance on test structure 400 is measured. The overall capacitance of test structure 400 then equals the predicted capacitance for the representative unit 405 multiplied by the number of such units required to occupy the area of test structure 400.

A test structure for measuring capacitance generally includes a top conductor plate and a bottom conductor plate. If the top conductor plate is the lowest conductor layer of the given process, the substrate underneath the top plate is considered the bottom conductor plate.

Creatingr a SEM "ruler"

The present invention provides also a method for calibrating SEM photographs. Under this method, a test structure provides a grating of parallel conductors with known lateral pitch in one or more layers, which can then be used as a built-in reference for dimensional measurements along different directions of the SEM photograph.

Figure 9A:
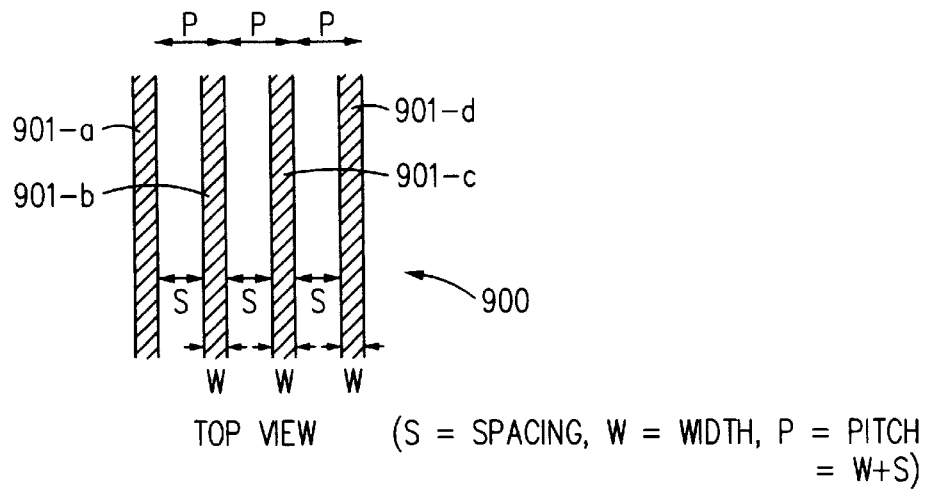
FIG. 9a shows a conductor pattern 900, including parallel conductors 901-a, 901-b, 901-c and 901-d used as a ruler in a SEM photomicrograph.
Figure 9B:
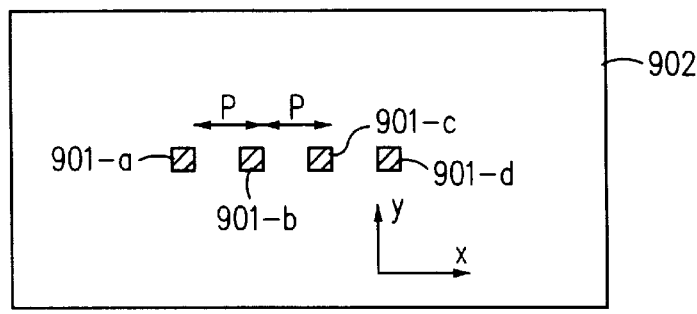
FIG. 9b illustrates a SEM photograph 902 of conductor pattern 900 positioned in a horizontal direction.

FIG. 9a shows an example of a test structure 900, which is used as a reference or "ruler" for dimensional measurements along a lateral dimension in a SEM photograph. Test structure 900 contains a number of conductor fingers 901-*a* to 901-*d* separated from each other by a known pitch. A cross-section of the fabricated test structure 900 in a SEM photograph 902 is illustrated in FIG. 9*b*. Since test structure 900 has a known pitch, the pitch P between the images of any pair of adjacent fingers in fingers 901-*a*, 901-*b*, 901-*c* and 901-*d* in SEM photograph 902 is proportional to the actual pitch between any pair of adjacent conductors within conductors 901-*a* to 901-*d*. Thus, the image of test structure 900 in photomicrograph 902 serves as a ruler for other features in the lateral, or "horizontal,"n direction (the "x" direction in FIG. 9*b*).

Figure 9C:
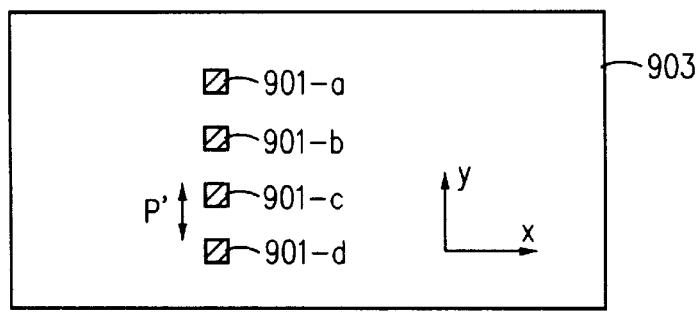
FIG. 9c illustrates a SEM photograph 903 of conductor pattern 900 positioned in a vertical direction.

By rotating test structure 900 90 degrees and then obtaining a SEM photograph 903, as illustrated in FIG. 9*c*, test structure 900 can then serve as a "vertical" ruler in for SEM photographs taken under the same magnification. SEM photograph 903 can then be used to calibrate the vertical direction: since the pitch PI in SEM picture 903 is proportional to the actual fabricated pitch of conductors 901-*a* to 901*d*, pitch P' of SEM picture 903 thus provides a reference for accurate dimensional measurements in the vertical "y" direction , as shown in FIG. 9*c*. This technique is particularly useful when a camera in the SEM equipment does not have a 1:1 aspect ratio.

Figure 7:
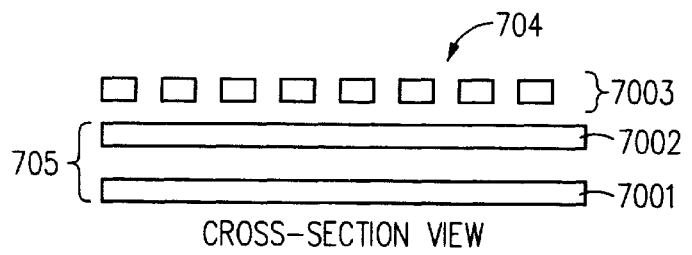
FIG. 7 shows a parallel-plate-capacitor test structure 705 including a ruler 704 in conductor layer 7003.
Figure 8:
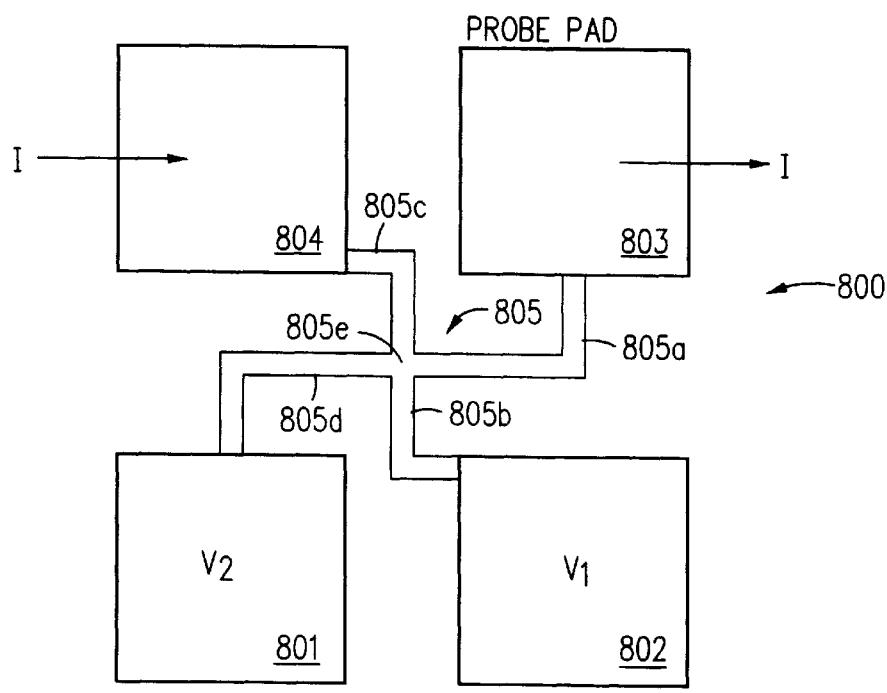
FIG. 8 shows a van der Pauw test structure 800 of the prior art for determining a sheet resistivity for a conductor layer.

Parallel conductors, such as those similar to conductors 901*a* to 901*d* of test structure 900, can be found in many test structures. For such test structures, no additional structures need to be included to provide the ruler. However, for a test structure without such a parallel conductor pattern, the parallel conductor pattern can be provided additionally in a "free" layer (i.e., a layer which is not expected to contribute significantly to the relevant electrical properties of the test structure). By placing the ruler in a free layer, electrical measurements are not compromised. For example, as shown in FIG. 7, a ruler 704 is provided in conductor layer 7003 above conductor layers 7001 and 7002 forming a parallel-plate capacitor structure 705.

As mentioned above, many integrated circuits include conductor patterns that can serve as the SEM reference discussed above. These conductors need only have known pitches, and not constant pitches. Thus, the method described above is applicable to SEM measurements in general, and is not limited to test structures. Because a typical manufacturing process results in centerlines of conductors very predictably placed, such a ruler can provide a highly accurate reference. A regular grating provides the easiest reference to use, because its edge-to-edge spacing directly reflects its centerline spacing. Clearly, however, other conductor patterns with know center-to-center spacings can also serve as rulers. Further, this method is self-correcting. For example, if the plane of a cross-section is not perpendicular to the conductors, all features are distorted alike, so that the ruler remains a reference to the features in the cross-section.

Determining Critical-dimension Loss

Figure 10:
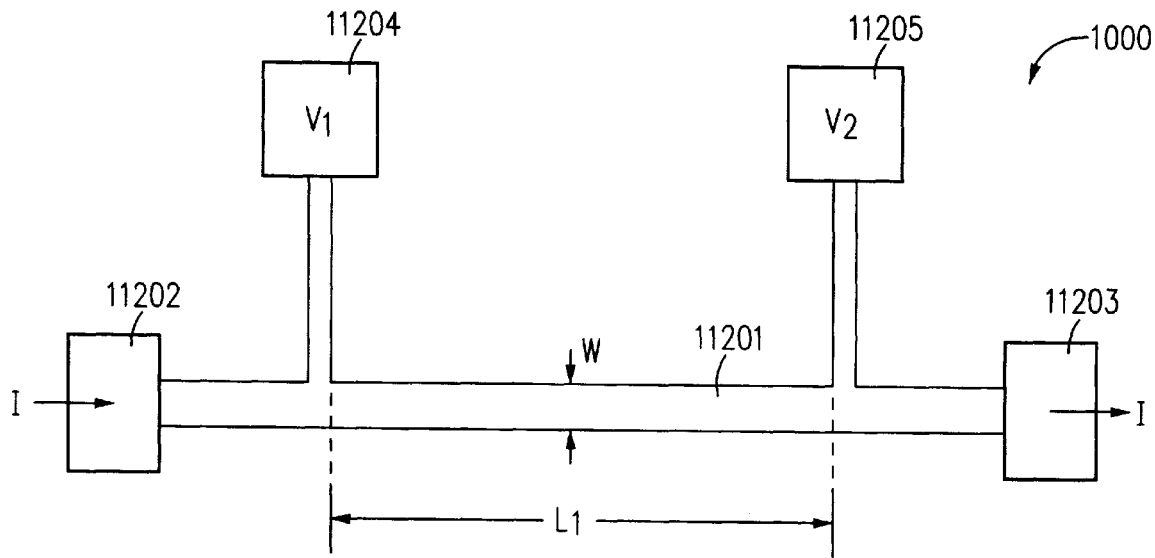
FIG. 10 shows a four-point Kelvin test structure 1000 for determining a sheet resistivity for a conductor layer; four-point Kelvin test structure is A relatively insensitive to critical-dimension loss.

To avoid the destructive effects of a large current in a highly conductive layer and yet providing a structure relatively insensitive to CD loss, the present invention provides, for determining the resistance of a conductor layer, a four-point Kelvin structure without a square central portion. FIG. 10 shows one embodiment of the present invention in a Kelvin structure 1000. In Kelvin structure 1000, rectangular portion 11201 for which a resistance is measured. Rectangular portion 11201 has a length L which is much greater than its width W. A current I is forced across the length of rectangular portion 11201 via probe pads 11202 and 11203 to create a voltage difference $\Delta V=V1-V2$ along the length of rectangular portion 11201, which is measured across probe pads 11204 and 11205. The sheet resistance $\rho$ is thus determined by:

$$\rho = \Delta V / I * W / L$$

By choosing a width W which is much larger than the minimal width $W_{min}$ for conductors in the layer in question (e.g., $W=20*W_{min}$), Kelvin structure 1000 is relatively insensitive to CD loss. Further, by having a length L much greater than its width W, thereby raising its resistance R along length L, test structure 1000 maintains a relatively measurable voltage difference across probe pads 11204 and 11205, while avoiding excessive heating effects because of the relatively smaller current. Rectangular portion 11201 is provided only for illustrative purpose. In fact, the shape of the portion across which resistance is measured is not essential for achieving the results above. To provide the requisite measurable resistance, an effective length in the direction of current flow which is significantly greater than its effective width suffices. For example, region 11201 could be replaced with a serpentine resistive trace which has a total length greatly exceeding its width, provided that the resistive trace's width significantly exceeds the minimum width $W_{min}$ for the conductor layer. A field solver can be used to calculate the effective length-to-width ratio, and hence the relationship between R and $\rho$, using well-known techniques.

As mentioned above, the amount of CD loss depends partly on micro-loading. Micro-loading results from the proximity of an interconnect wire relative to conductors in its surroundings (e.g., spacings between this wire and neighboring lines). Thus, it is desirable to establish the relationship between CD loss of an interconnect wire and the local widths and spacings of neighboring wires. The present invention provides a method for determining the dependency of the fabricated width of an interconnect trace with respect to the density of neighboring conductors. This method of the present invention determines both the magnitude of the CD loss and the neighborhood size over which CD loss should be evaluated.

Figure 11:
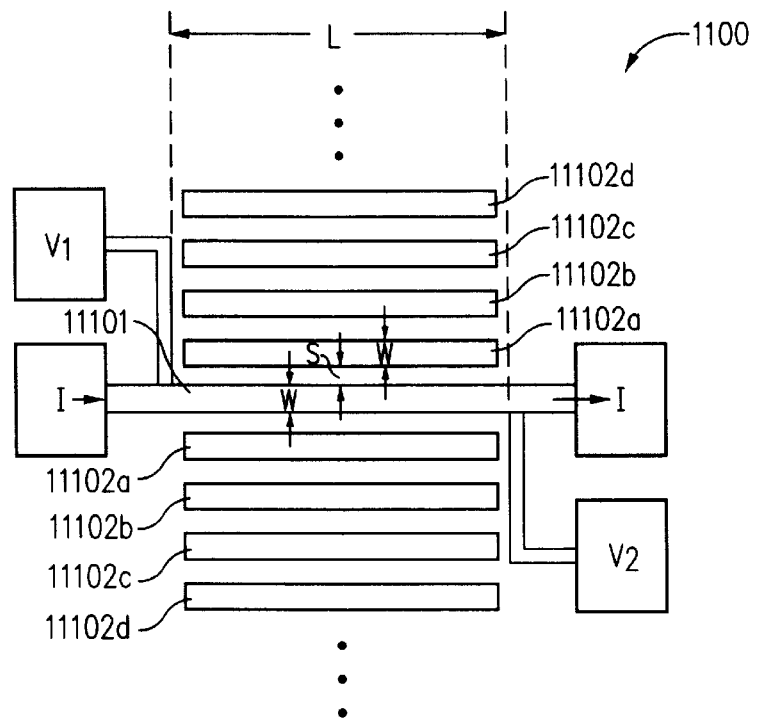
FIG. 11 shows a test structure 1100 for determining a critical-dimension loss.
Figure 12A:
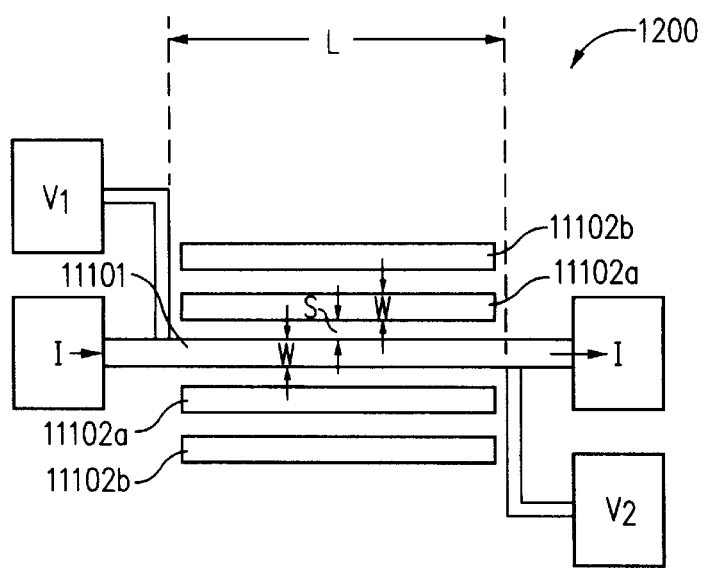
FIG. 12a shows a test structure 1200 for determining the effect of micro-loading on critical-dimension loss.

The method of the present invention uses a family of test structures derived from the basic structure 1100 shown in FIG. 11. Under the present invention, the number of neighboring traces on either sides of an interconnect trace are varied from 0 to 20 to explore the range of the micro-loading effect. For example, FIG. 12*a* shows one member 1200 of a family of test structures. Test structure 1200 is used to examine the micro-loading effect of only two pairs of neighboring traces. Thus, only two neighboring pair of conductor traces (labeled 11102*a* and 11102*b*, respectively) are provided in test structure 1200. Other members of the family of test structures provide for four neighboring pair of traces (where only the pairs of neighboring traces corresponding to 11102*a*–11102*d* of FIG. 11 are provided), 6 neighboring trace pairs and so forth. Naturally, no micro-loading effect are assumed present when no neighboring traces are provided. For each member of the family of test structures, the resistance R of the structure is measured as described above.

Then the line-width correction $\Delta W$ associated with the CD loss for each configuration is calculated using the equation:

$$\Delta W = W - (L*\rho/R)$$

where sheet resistance $\rho$ can be determined using one of the previously described techniques.

In addition, in the family of test structures, the conductor width W and the conductor spacings S are varied for each selected number of neighboring conductor trace pairs. The family of test structures for measuring CD loss in one embodiment of the present invention are summarized in the following table:

TABLE 1

|  | $S_{min}$ | $2\,S_{min}$ | $4\,S_{min}$ | "∞" |
|---|---|---|---|---|
| $W_{min}$ | 2, 3, 4, "∞" | 2, 4, 6, "∞" | 2, 4, 6, "∞" | 0 |
| $2\,W_{min}$ | 2, 4, 6, "∞" | 2, 4, 6, "∞" | 2, 4, 6, "∞" | 0 |
| $4\,W_{min}$ | 2, 4, 6, "∞" | 2, 4, 6, "∞" | 2, 4, 6, "∞" | 0 |

In Table 1, $W_{min}$ is the minimum trace width for a given manufacturing process, and $S_{min}$ in is the minimum allowed spacing in the same process. Thus, the value (2, 4, 6, "∞") in entry "$W_{min}$, $S_{min}$" denotes a family of test structures containing a central minimum-width trace, with 1, 2, 3 and 4 neighboring conductor trace pairs in its neighborhood, each conductor trace having minimal width $W_{min}$, and each neighboring conductor trace being separated a minimal spacing $S_{min}$ from each of its neighboring conductor trace. (In this instance, the case of infinite number of neighboring traces is approximated by 4 pairs of neighboring conductor traces, and the case of no neighboring traces is approximates infinite spacing between conductors).

In principle, interconnect widths can vary from $W_{min}$ up to the full width of a die. However, as discussed previously, CD loss affects minimally electrical properties of very wide lines (i.e., where the width greatly exceeds the thickness of the trace). Similarly, interconnect spacing can vary from $S_{min}$ up to the full width of a die. In practice, placing no neighbor within a large multiple of $S_{min}$, e.g., 40 μm for a 0.35 μm process, will characterize the full range of interesting spacing variations. Therefore, it suffices to apply the method of the present invention to a few representative widths and spacings of interest, including minimal width $W_{min}$ and minimum spacing $S_{min}$. For example, Table 1 suggests a possible family of test structures sufficient to characterize a 0.35 μm process.

Of course, the number of neighboring conductor trace pairs, the conductor widths and the spacings needed to characterize CD loss of a particular process must be determined empirically. Thus, while Table 1 provides a specific example, the method of the present invention for characterizing CD loss is not limited by widths, spacings, and the number of neighboring traces shown therein. Further, while Table 1 shows integral multiples of conductor widths and spacings, fractional multiples of minimal widths or spacings can also be used, where appropriate, to characterize the limits of the process.

Figure 12B:
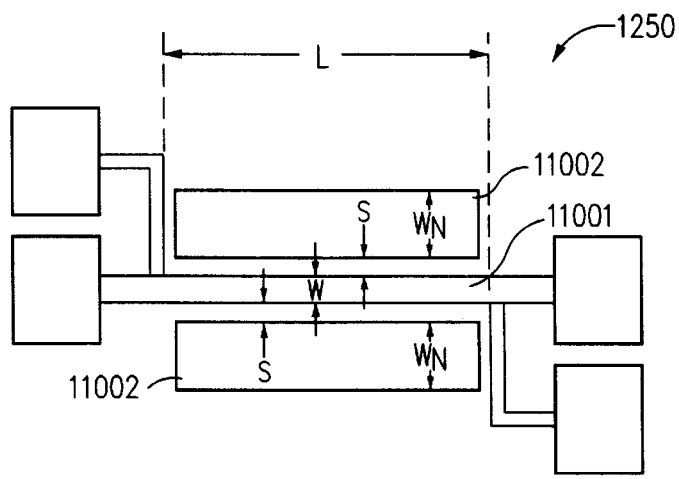
FIG. 12b shows a test structure 1250 for determining the effect of micro-loading on critical-dimension loss, using a fixed number of neighboring conductor traces of various widths.

Variations in the family of test structures are also possible. For example, instead of varying the number of neighboring conductor trace pairs, the method can be applied to a family of test structures with a fixed number of neighboring conductor trace pairs (e.g., two neighboring traces), but varying the conductor widths, so as to determine the extent of the microloading effect. This example is illustrated by FIG. 12b, which shows a test structure 1250, in which the central trace 11001 of width W and length L is separated by a spacing S from a single pair of neighboring conductor traces 11002. In this family of test structures, the width $W_N$ of neighboring conductor traces 11002 are varied. Similarly, the method of the present invention can also be used in conjunction with a family of test structures in which all the neighboring conductor traces are located on one side of the conductor trace which resistance is measured.

Further, even though the measured resistance of a conductor trace is used to calculate CD loss in the above description, the more costly and time-consuming measurements using SEM photographs can also be applied in accordance with the present invention to characterize CD loss.

Determining Interlayer Dielectric Thickness

Similar to CD loss, the present invention provides a method for characterizing "proximity effects," i.e., the dependency of dielectric thickness with respect to local width and spacing variations of neighboring interconnect wires below the dielectric layer. In addition to the proximity effect, the present invention provides a method also to characterize the dependency of dielectric thickness within a region on interconnect outside of the region ("global effect").

The method of present invention requires a first determination of the values of certain interconnect process parameters. Metal thicknesses and ILD thicknesses can be determined by well-known techniques, e.g., SEM measurements of cross-sections of interconnect wires. Similarly, interlayer permittivities can by determined by (i) measuring the capacitance C of a parallel-plate capacitor test structure, (ii) measuring the ILD thickness h between the parallel plates using a SEM technique, and (iii) calculating the permittivity k from the relationship:

$$k = (C*h)/(\epsilon*A)$$

where $\epsilon$ is the permittivity of the dielectric material and A is the area of the test structure.

The present invention provides a method for determining a full range of ILD thickness variations, using a family of test structures. Although the method described herein measures ILD thicknesses using an electrical method, the ILD thicknesses under the present invention can also be determined using SEM measurements.

Figure 13A:
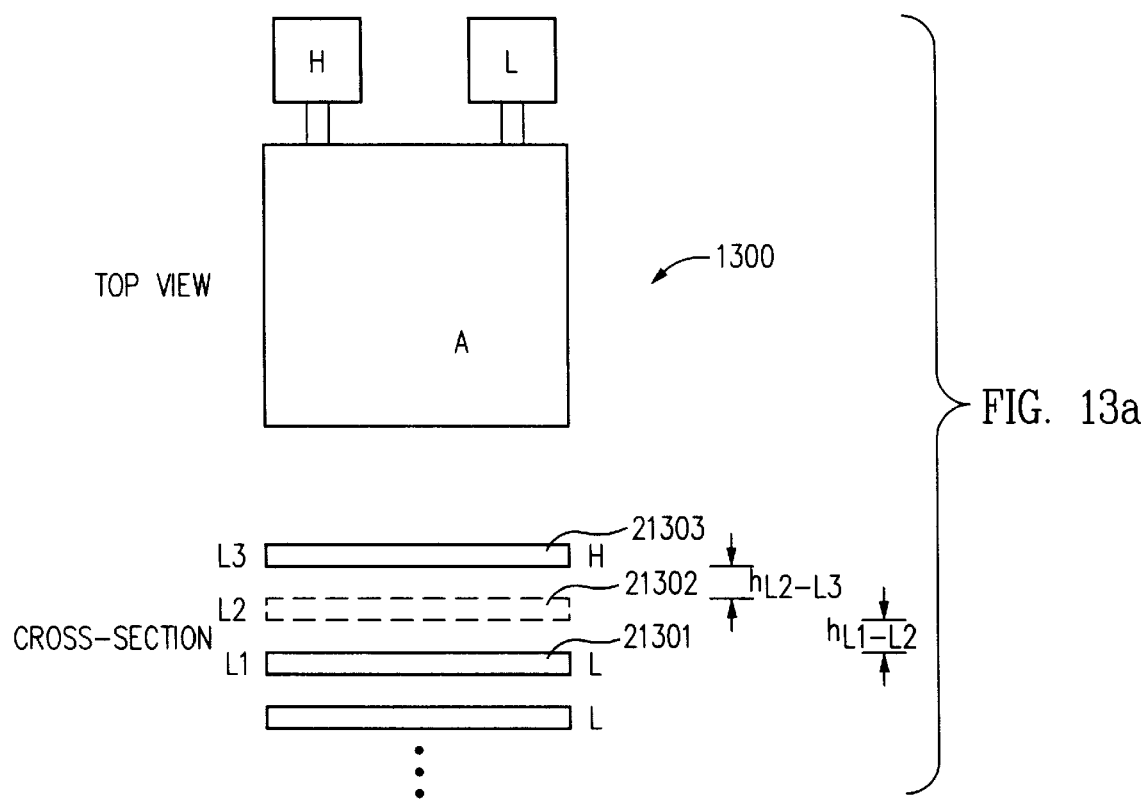
FIG. 13a illustrates a method of the present invention applied to measure capacitance C of a parallel-plate test structure 1300, in which an ILD thickness above an absent conductor plate 21102 in conductor layer L2 is measured.

FIG. 13a illustrates a method of the present invention applied to measure capacitance C of a parallel-plate test structure 1300, in which ILD thickness $h_{L2-L3}$ between conductor layers L2 and L3, above an absent conductor plate 21302 (i.e., no conductor locally present in conductor layer L2) is measured. Test structure 1300 is one member of a family of test structures for measuring ILD thicknesses under the present invention. In FIG. 13a, conductor plate 21303 in conductor layer L3, and any conductor structure above conductor layer L3 (e.g., a SEM ruler, not shown), are connected to one probe pad to form a first electrode, and plate 21301 in conductor layer L1, and any other conductor plates below conductor layer L1, are connected to another probe pad to form a second electrode. The ILD thickness $h_{L2-L3}$ is calculated from the equation:

$$C = \epsilon_0 * A / (h_{L1-L2}/k_{L2-L3} + t_{L2}/k_{L2} + h_{L1-L2}/k_{L1-L2})$$

where C is the measured capacitance, $t_{L2}$ is the metal thickness of conductor layer L2, $h_{L1-L2}$ is the ILD thickness between conductor layers L1 and L2, the k's are the associated inter- and intralayer dielectric constants determined as described above, $\epsilon_0$ is permittivity constant of free space, and A is the area of the test structure. The various interconnect process parameters can be determined as described above or approximated by well-known techniques.

Figure 13B:
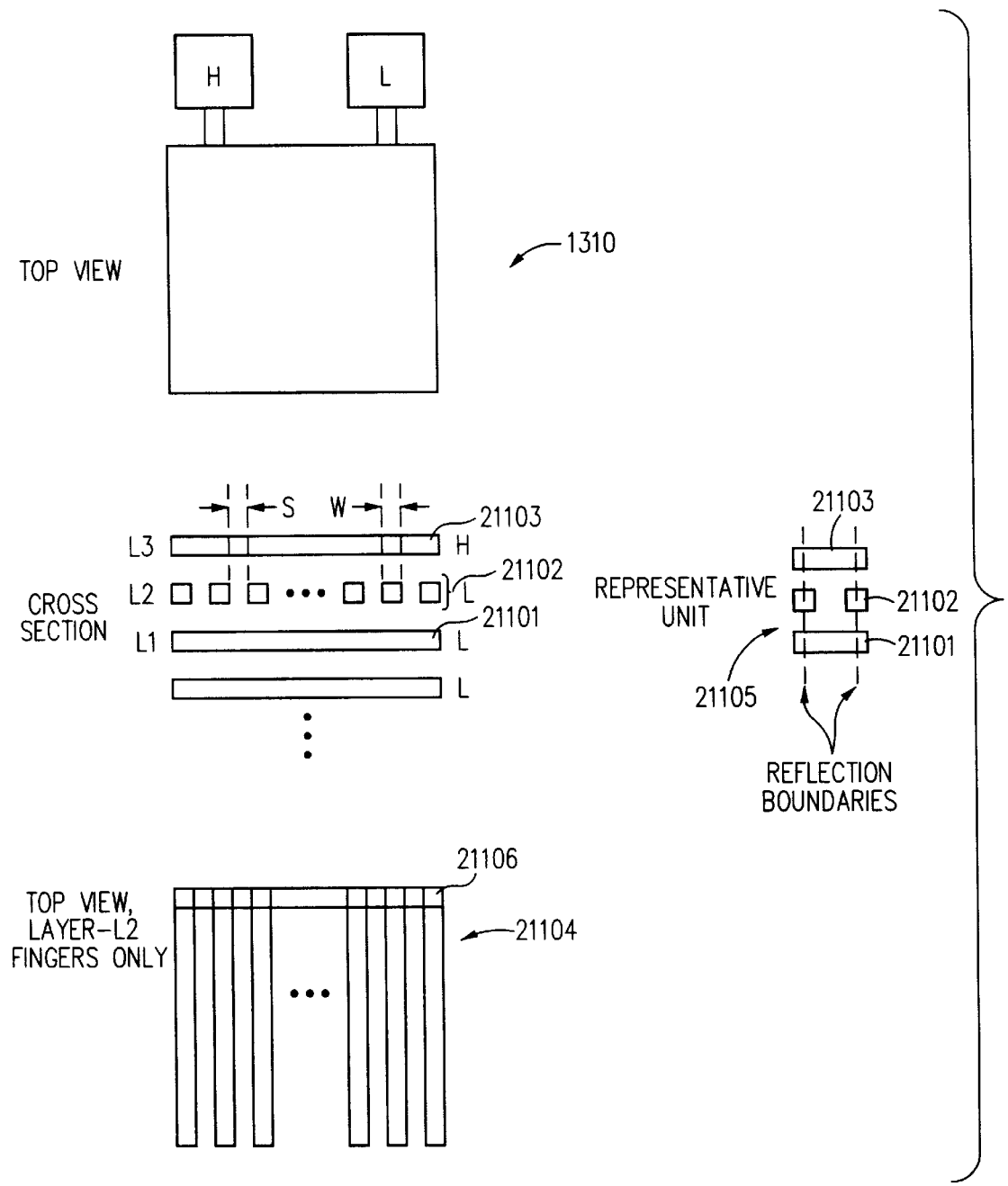
FIG. 13b illustrates a method of the present invention applied to measure capacitance C of a parallel-plate test structure 1310, in which an ILD thickness above a grating 21102 of conductors in conductor layer L2 is measured.

Another member of the family of the test structures for measuring ILD thicknesses is test structure 1310 shown in FIG. 13b. Test structure 1310 determines an ILD thickness above conductor layer L2 using a grating 21102 of conductor traces in conductor layer L2. In test structure 1310, grating 21102 is provided as a set of parallel conductors with a selected width W and a selected spacing S. In the test structure 1310, the parallel conductors ("fingers") of grating 21102 of layer L2 are shorted by conductor trace 21106, forming a "comb" structure 21104. Conductor plate 21103, and any conductor structure above conductor layer L3, are connected to one probe pad to form a first electrode, and grating 21102 and conductor plate 21101, and any conductor structures below conductor layer L1, are connected to another probe pad to form a second electrode.

To determine the ILD thickness $h_{L2-L3}$ for test structure 1310, a field solver can be used to calculate capacitance $C_{unit}$ of unit 21105, which represents a representative element of test structure 1310—two parallel conductors in layer L2, between conductor plates 21103 of layer L3 and 21101 of layer L1. Since the total capacitance C of test structure 1310 can be approximated by multiplying $C_{unit}$ by the number of fingers and the length of the fingers in comb structure 21104, the measured capacitance C can be used to obtain capacitance $C_{unit}$ using the successive approximation technique provided above. The various dimensions (including the line-width correction factors) and permittivities for the representative unit 21105 can be determined as described above. The values of interconnect process parameters $\Delta W_{ELL}$, $h_{L1-L2}$, $t_{L2}$ $k_{L2}$, and $k_{L2-L3}$ for the representative unit 21105 are determined in the manner described above. The ILD thickness $h_{L2-L3}$ is that ILD thickness between layers L2 and L3 at which the field solver predicts for capacitance $C_{unit}$ a capacitance value which is consistent with the measured capacitance C, holding the values of other interconnect process parameters constant.

In test structure 1310, if the fingers of comb structure 21104 are closely spaced, most of the electric field lines lie within the space between grating 21102 and conductor plate 21103 of layer L3. Consequently, the measured capacitance, and hence, the calculated ILD thickness, depend only weakly on $k_{L2}$ (the intralayer dielectric constant between conductors in conductor layer L2). Thus, in closely spaced grating, an estimate of intralayer dielectric constant $k_{L2}$ to within 15% is sufficient to provide an estimate for ILD thickness $h_{L2-L3}$ to within a few percentage points.

The method of the present invention measures ILD thicknesses as a function of conductor width W and conductor spacing S, using a family of test structures which includes test structures 1300 and 1310 shown in FIGS. 13a and 13b respectively. In particular, in addition to test structure 1300, the remaining members of the family of test structures are derived by varying conductor layer L2 's conductor width W and conductor spacing S of test structure 1310. An ILD thickness which corresponds to each conductor width W and each conductor spacing S is measured. Table 2 summarizes a god family of test structures in one embodiment of the present invention:

TABLE 2

|  | 0 | $S_{min}$ | 2 $S_{min}$ | 4 $S_{min}$ | "∞" |
|---|---|---|---|---|---|
| 0 |  |  |  |  | x |
| $W_{min}$ |  | x | x | x |  |
| 2 $W_{min}$ |  | x | x | x |  |
| 4 $W_{min}$ |  | x | x | x |  |
| "∞" | x |  |  |  |  |

In Table 2, an x in a table entry represents a test structure for the selected conductor width and conductor spacing. Width $W_{min}$ is the minimum allowed conductor trace width for the process, and $S_{min}$ is the minimum allowed spacing for the same process. In principle, the conductor width can vary from 0 up to the full width of a die. However, the case of infinite conductor width (corresponding also to the case of zero conductor spacing) is provided by a blanket layer of conductor L2 over a sufficiently large area. Similarly, interconnect spacing can vary from 0 up to the full width of a die. However, in the case of infinite conductor spacing (corresponding also to the case of zero conductor width) is the same as an absence of a local conductor structure in layer L2 over a sufficiently large area.

Thus, while Table 2 provides a specific example of a family of test structures, the method of the present invention for measuring ILD thicknesses is not limited by conductor widths and conductor spacings. Further, while Table 2 shows integral multiples of conductor widths and spacings, fractional multiples of minimal widths or spacings can also be used, where appropriate, to characterize the limits of the process. Also, the present method is not limited to grating structures with constant widths and spacings—including irregular test structures (e.g., alternating two it different line widths). In particular, for use in conjunction with chemical mechanical polishing (CMP) or similar planarization techniques, local proximity effects depend only upon the average area covered by conductor traces over fairly large areas of conductor layer L2, so that a family of test structures under the present invention with a suitable range of covered areas can be used.

While the above method provides characterization of a full range of dielectric thicknesses as a function of proximity effects, the present invention also provides a method for characterizing the magnitude and extent to which a given interconnect pattern in one region affects dielectric thicknesses outside the region. Under this method, test structures are placed both proximate to and away from a relatively large area or region of the substrate on which the interconnect structure is fabricated. This method is illustrated by FIGS. 16a–16c.

Figure 2:
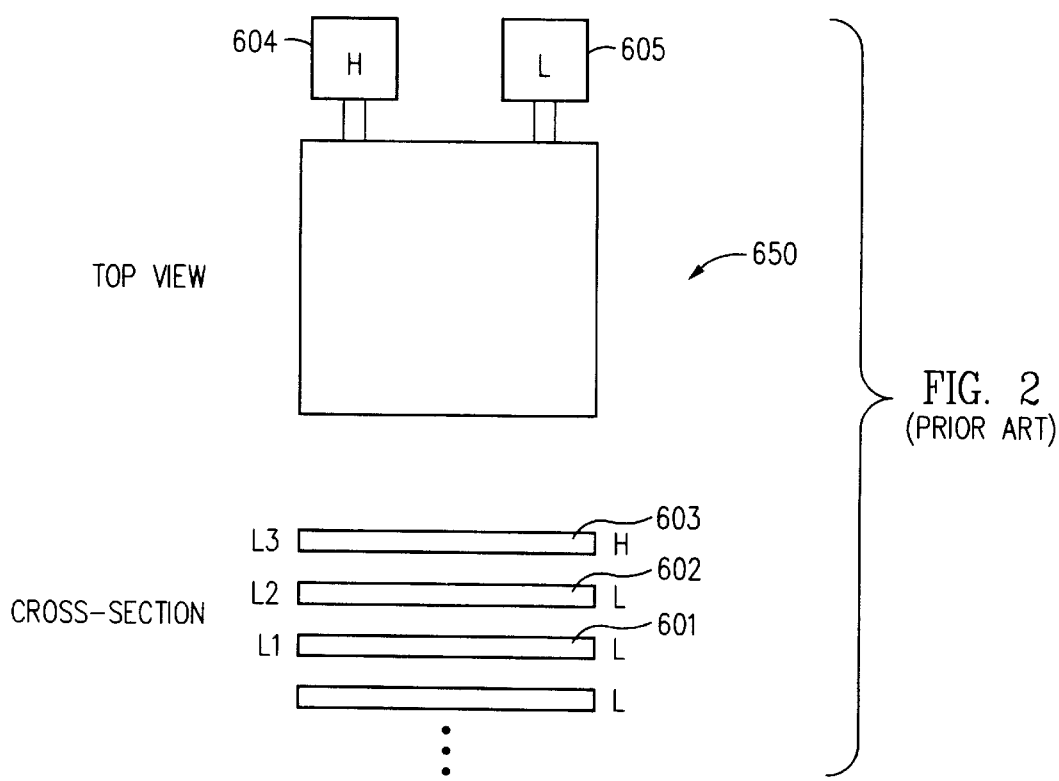
FIG. 2 shows a test structure 650 for determining interlayer dielectric thickness above a conducting layer containing a solid plate.
Figure 16A:
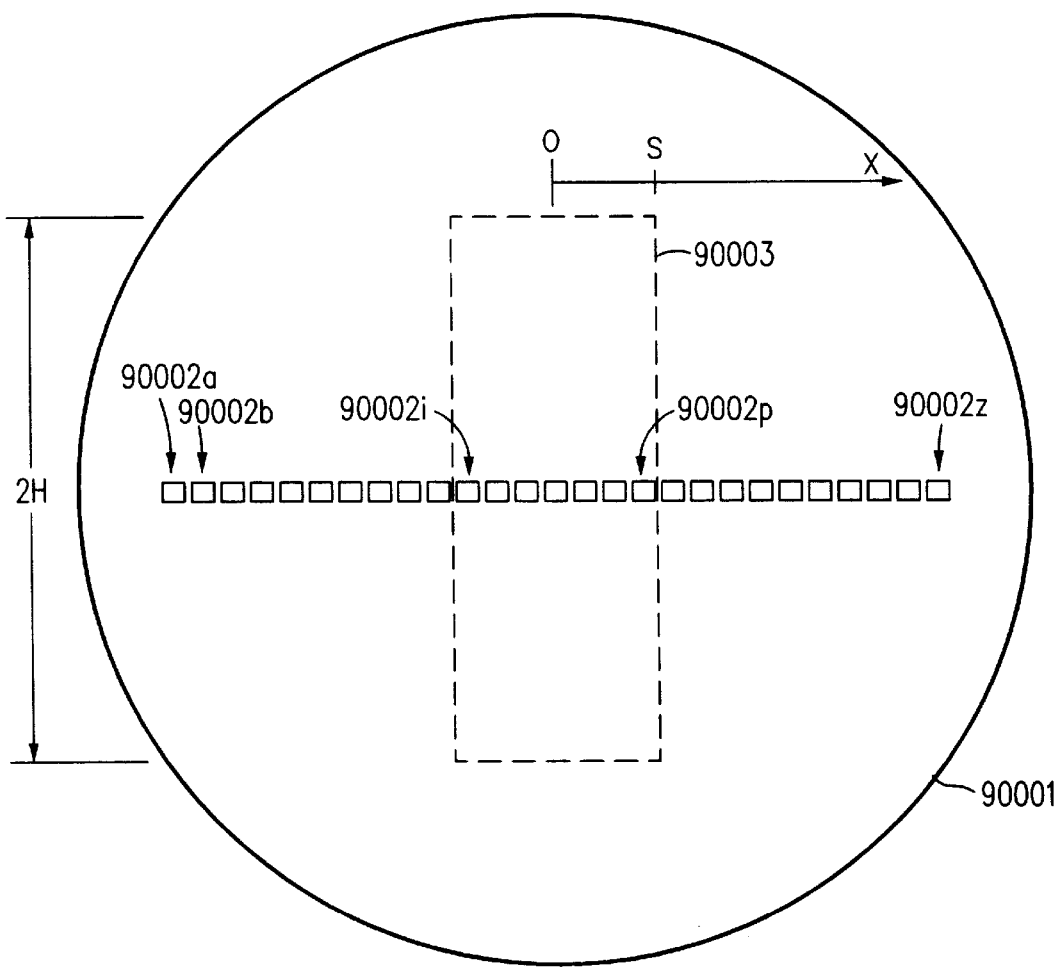
FIG. 16a shows, on a semiconductor wafer 90001, a conductor pattern place within an area 90003 and a row of teat structures 90001a to 90001z placed along an axis of wafer 90001 positioned to measure a global effect of the conductor pattern on local dielectric thickness in the test structures within and outside area 90003, in accordance with the present invention.
Figure 16B:
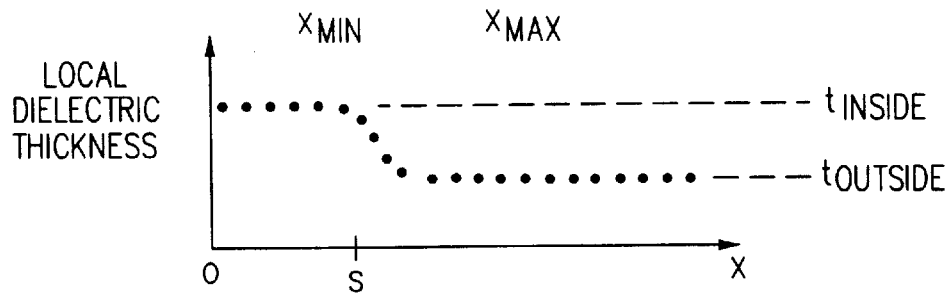
FIG. 16b plots the local dielectric thicknesses in test structures 90001a to 90001z of FIG. 16a along one axis of wafer 90001.
Figure 16C:
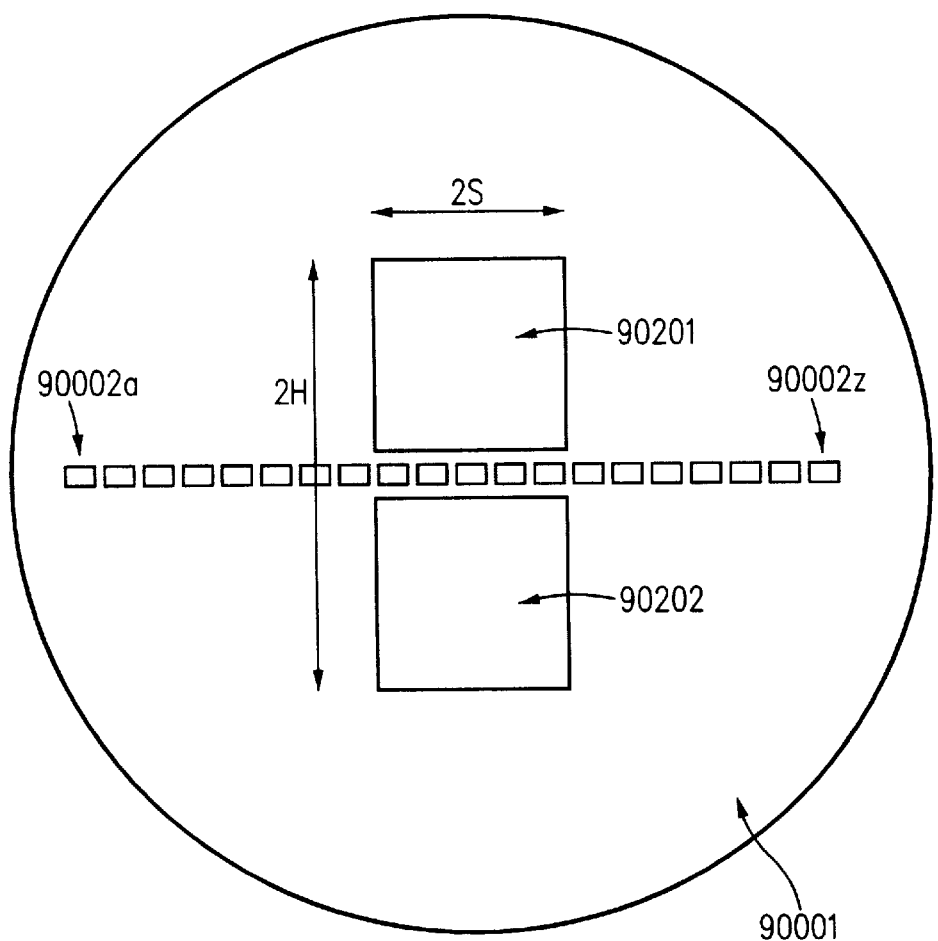
FIG. 16c shows, on semiconductor wafer 90001 of FIG. 16a, a conductor pattern comprising two conductor plates 90201 and 90202 within area 90003, representing a conductor array in which the conductor spacing is zero.

FIG. 16a shows a row of identical test structures 90002a–90002z placed on a semiconductor wafer 90001. Each of test structures 90002a–90002z can be provided by any of the previously discussed test structures for measuring dielectric thicknesses, e.g., test structure 1300 of FIG. 13a, test structure 1310 of FIG. 13b, or test structure 650 of FIG. 2.

On wafer 90001 is defined as 2S by 2H rectangular area 90003, where 2S and 2H are respectively the lengths of the shorter and longer sides of area 90003. Within area 90003 is provided a regular array of conductor traces of predetermined width and spacing, except within the vicinity of test structures 90002a to 90002z (e.g., for a 0.35 um feature size process, within 20 um of any of test structures 90002a to 90002z). The conductor traces within area 90003 are provided in the same conductor layer as the conductor layer (e.g., conductor layer L2) on which the ILD thicknesses measured by test structures 90002a to 90002z depend. As shown in FIG. 16a, test structures 90002i to 90002p are within area 90003, and test structures 90002a to 90002(i–1) and test structures 90002(p+1) to 90002z are outside of area 90003. Presumably, the dielectric thicknesses in test structures within area 90003 and outside of area 90003 are affected by the presence of the conductor traces within area 90003. FIG. 16c illustrates one instance in which the regular array of conductor traces having zero spacings, i.e., area 90003 is provided by two solid conductor places 90201 and 90202 in conductor layer L2.

Under a method of the present invention, the ILD thicknesses in test structures 90001a to 90001z are measured electrically, via SEM or by any other method to obtain for each test structure the average ILD thickness within its local region. The magnitude and extent of the global effect imposed by the conductor traces within area 90003 on these local ILD thicknesses can be observed by the difference in average ILD thicknesses between test structures within area 90003 (i.e., test structures 90001$i$ to 90001$p$) and test structures outside of area 90003 (i.e., test structures 90002$a$ to 90002$(i-1)$ and test structures 90002$(p+1)$ to 90002$z$).

FIG. 16$b$ is a plot of local ILD thicknesses in a row of test structures across one half of wafer 90001, i found in instance, in one embodiment of the present invention. As shown in FIG. 16$a$, a baseline ILD thickness ($t_{inside}$) is seen within area 90003, up to a distance $x_{min}$ from the center of wafer 90001, and a base line ILD thickness ($t_{outside}$) is seen a distance outside of area 90003, beyond a distance $x_{max}$ from the center of wafer 90001. Locations $x_{min}$ and $x_{max}$ are respectively locations where the local ILD thickness deviates from $t_{inside}$ and $t_{outside}$ by a predetermined percentage. Thus, the magnitude of the global effect on local ILD thickness can be defined, for example, as the difference between $t_{inside}$ and $t_{outside}$. The extent within which the global effect on local ILD thickness operates can be defined as the separation between $x_{max}$ and $x_{min}$. Of course, the profile shown in FIG. 16$b$ is just one example provided by one manufacturing process. An entirely different profile may be found under another manufacturing process. For example, the difference between ILD thicknesses $t_{inside}$ and $t_{outside}$ inside and outside of area 90003 can be so small that the magnitude and extent of the global effect on local ILD thickness are both effectively non-existent.

Many variations can exist in the method for measuring the global effect on ILD thickness. Such variations include, for example: (a) test structures need not be placed within area 90003, so that the regular array of conductor traces can be continuous along the length area 90003; (b) multiple rows of test structures can be provided, and (c) multiple conductor layers can be examined on the same wafer simultaneously.

Determining Intralayer Permittivity

As the feature sizes of integrated circuits decrease, the capacitive coupling between conductor Gus traces in the same conductor layer can exceed the coupling between conductor traces of different conductor layers. This intralayer capacitive coupling is especially strong between minimal-width wires of the same conductor layer at minimal spacing. Consequently, new materials, new processing techniques, and multilayer dielectrics are being developed to reduce this intralayer capacitive coupling. Thus, it is desirable to accurately determine line-width correction factors and intralayer permittivities.

The interconnect model described above in conjunction with FIG. 1 provides for homogeneous intralayer and interlayer dielectric materials. However, in state-of-the-art semiconductor processes, multiple layers of dielectric material may be used for some of these intralayer or interlayer dielectric layers. Some dielectric materials are thin conformal layers, others form pockets. Consequently, the intralayer permittivity between parallel conductors within a conductor layer can vary with conductor spacing in that conductor layer, since the average composition of the dielectric material between conductors due to presence of these pockets and conformal layers can differ because of different spacings.

Figure 14:
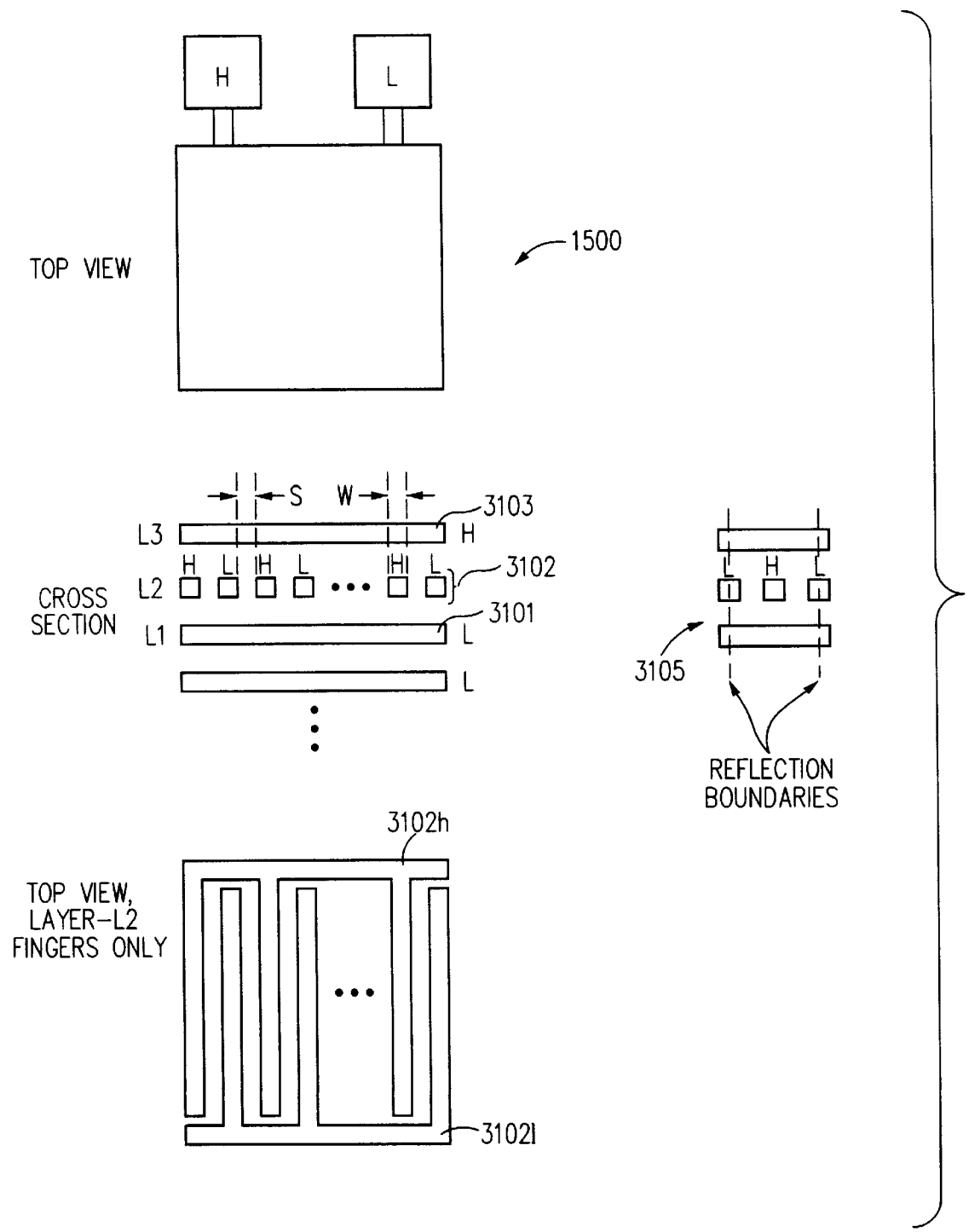
FIG. 14 illustrates a method of the present invention applied to a test structure 1500, which provides a measured capacitance C relating the intralayer dielectric constant $k_{L2}$ between conductor traces 3102, for a given width W and spacing S in interconnect layer L2.

Under a method of the present invention, the intralayer permittivity $k_{L2}$ between parallel conductors of conductor layer L2 spaced a given spacing apart is calculated. Under that method, which is provided in conjunction with test structure 1500 of FIG. 14, a measured capacitance C of test structure 1500 provides an intralayer dielectric constant $k_{L2}$ between conductor traces 3102 of a given width W and spacing S in conductor layer L2. In test structure 1500, conductor traces 3102 are made up of two interleaved comb structures 3102$h$ and 3102$l$ in conductor layer L2. To measure capacitance C, conductor plate 3103 of conductor layer L3, any structure above conductor layer L3, and comb structure 3102$h$ are connected to one probe pad to form a first electrode, and comb structure 3102$l$, conductor plate 3101 of conductor layer L1, and any conductor structure below conductor layer L1 are connected to another probe pad to form a second electrode.

To determine the intralayer dielectric constant $k_{L2}$ between comb structures 3102$h$ and 3102$l$, a field solver can be used to calculate a capacitance $C_{unit}$ of a representative unit 3105 using the measured capacitance C and the successive approximation technique described above. Capacitance $C_{unit}$ is the capacitance between a conductor in comb structure 3102$h$ and an adjacent conductor in comb structure 3102$l$. Thus, the measured capacitance C can be approximated by multiplying capacitance $C_{unit}$ by the number of parallel conductor pairs between comb structures 3102$h$ and 3102$l$ and the length of each conductor. The interconnect process parameters $\Delta W_{L2}$, $h_{L1-L2}$, $t_{L2}$, $h_{L1-L2}$ $k_{L1-L2}$, and $k_{L2-L3}$ for the representative unit 3105 can be determined as described above or approximated by well-known techniques. Permittivity ken is that permittivity value at which the field solver provides a capacitance $C_{unit}$ which agrees with the measured capacitance C, holding the values of other interconnect process parameters constant.

The full range of variations of permittivity $k_{L2}$ as a function of conductor spacing in layer L2 is provided by measuring the capacitance of a family of test structures based on test structure 1500. In these test structures, the widths W and spacings S between the parallel conductor traces of comb structures 3102$h$ and 3102$l$ are varied. In one embodiment of the present invention, the full range of variations of the permittivity $k_{L2}$ is characterized by measuring a sufficiently large number of widths W and spacings S of L2 conductors. The family of test structures of the present invention measures a full range of values for an intralayer dielectric constant, for various conductor widths W and conductor spacings S. These results are summarized in Table 3 below:

TABLE 3

|  | $S_{min}$ | 2 $S_{min}$ | 4 $S_{min}$ |
| --- | --- | --- | --- |
| $W_{min}$ | x | x | x |
| 2 $W_{min}$ | x | x | x |
| 4 $W_{min}$ | x | x | x |

In Table 3, an "x" indicate a selected conductor width W and a conductor spacing S for which a test structure derived from test structure 1500 is provided. Width $W_{min}$ is the minimum conductor trace width allowed under the process, and $S_{min}$, the minimum spacing allowed under the process. In principle, interconnect widths can vary from $W_{min}$ up to the full width of a die. Similarly, interconnect spacing can vary from $S_{min}$ up to the full width of a die. Table 3 provides a possible range for a 0.35 $\mu$m feature size process.

Of course, the method of the present invention for measuring intralayer dielectric is not limited to these width and spacing combinations summarized in Table 3. In fact, the method of the present invention can include any number of conductor widths or spacings. In addition, although Table 3 includes only parallel conductors of equal widths and spacings, asymmetrically placed conductors can also be provided. Although integral multiples of minimum widths and spacings are provided in the test structures summarized in Table 3, fractional multiples of minimal widths or spacings can also be provided to characterize the limits of the process.

Characterizing Conductors with "I"-shaped-Rectangular Cross-sections

Figure 15:
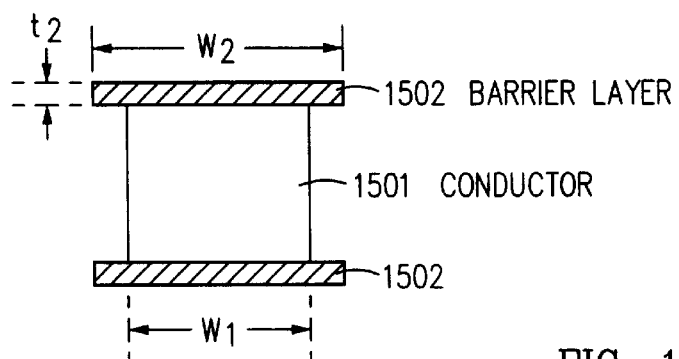
FIG. 15 shows, in processes where a metal layer includes a capping or barrier layer 1502 in conjunction with an conducting core 1502, conductor traces with I-shaped cross-sections are formed.

In the preceding description, interconnect structures are described using a brick model, under which conductors and intralayer dielectric portions have rectangular cross-sections and interlayer dielectric portions have locally constant thicknesses. However, certain state-of-the-art processes depart significantly from the brick model. In particular, as shown in FIG. 15, in processes where a metal layer includes a capping or barrier layer 1502 in conjunction with a conducting core 1501, core 1501 (typically formed by an aluminum layer) tends to etch faster than the barrier layer (typically formed by a tungsten layer), thereby resulting in conductor traces with I-shaped cross-sections.

The present invention provides a method to extend the methods described above for measuring CD loss, interlayer dielectric thicknesses and intralayer dielectric thicknesses to conductors with such I-shaped cross sections. The method of the present invention first determines the widths $w_1$ of the conductor core and $w_2$ of the barrier layer, for example, using SEM photographs of cross-sections of such conductors. In general, a variety of properties between width $w_1$ and width $w_2$ are possible: e.g., the measured width $w_2$ of the barrier layer is its drawn width, or the ratio of the measured width $w_2$ of the barrier layer to the measured width $w_1$ of the conductor core is found to be constant.

In general, the I-shape model depends upon the thickness $t_2$ of the barrier layer and its sheet resistance. The cross-section of a conductor trace used in a field solver is replaced by the cross-section predicted under the I-shape model, based on the properties empirically determined above. Given such an augmented interconnect model and the associated interconnect process parameter values, a field solver can predict the electrical characteristics of the resulting metal cross-section. For example, in a state-of-the-art 0.35 $\mu$m manufacturing process using tungsten barrier layers far thinner than the aluminum cores of conductors, the CD loss can first be obtained from an electrical (resistance) measurement in the manner described above. Thereafter, the line-width correction factor thus obtained is applied to the width $w_1$ of the aluminum core. Since the aluminum core is much more conductive and much thicker than the barrier metal, the width $w_1$ of the aluminum core then can be used to derive width $w_2$ of the barrier metal layer, without accounting in the measured electrical characteristic the resistivity of the barrier layer.

Similarly, in determining ILD thicknesses from capacitance measurements on test structures having the comb structures described above, the I-shape model can replace the brick model in field-solver runs used to determine or to check ILD thickness, since the values of the other interconnect process parameters are known. Also, in determining intralayer permittivity from capacitance measurements as described above, this I-shape model can again replace the brick model in field-solver runs used to determine or to check permittivity.

Note that the method of the present invention for I-shape conductors does not require that conductor traces have exactly I-shaped cross-sections, so long as the cross-section can be determined by such methods as the use of SEM photographs. For example, under the method of the present invention, the metal core need not be centered under the capping layers. Alternatively, two capping layers may have different dimensions. The present invention also applies to other cross-sectional shapes, e.g., a conductor having a trapezoidal cross-section.

The above detailed description is provided to illustrate specific embodiments of the present invention and is not intended to be limiting. Numerous variations and modifications within the scope of the present invention are possible. The present invention is defined by the following claims.

We claim:

1. A method for determining a value of a material property related to vertical dimensions of conductors and dielectric layers in an integrated circuit structure fabricated under a manufacturing process, said method comprising:

fabricating using said manufacturing process two or more test structures, each of said test structures being a physical model of said integrated circuit structure designed to allow a measurement of a quantity parametrically dependent upon said material property, and each of said test structures differing from another one of said test structures by expected measured values of said quantity; and deriving said material property from said independent measurements of said test structures.

2. A method as in claim 1, wherein said material property relates to a thickness of an interlayer dielectric layer in a process for manufacturing an integrated circuit, said measurable quantity being a value of an interconnect design parameter.

3. A method as in claim 2, wherein said measurable quantity is a value of an electrical property, said deriving step comprising measuring said value of said electrical property in each of said test structures; and deriving from said value of said electrical property a value of said thickness of said interlayer dielectric layer.

4. A method as in claim 3, said method further comprising the steps of:

using a field solver to predict a value of said measurable quantity based on successively approximated values of said thickness;

selecting one of said successively approximated values as said value of said thickness, when said selected value substantially approximates said measured value of said measurable quantity.

5. A method as in claim 2, wherein said value of said interconnect design parameter being a width of a conductor in said interconnect layer.

6. A method as in claim 2, wherein said value of said interconnect design parameter being a spacing between two conductors in said interconnect layer.

7. A method as in claim 1, wherein said material property being the value of a permittivity of an intralayer dielectric in a process for manufacturing an integrated circuit, and wherein said step of fabricating step fabricates a test structure, said test structure including a first conductor and a second conductor across which an electrically measurable quantity of an electrical property corresponding to said value of said permittivity.

8. A method as in claim 7, wherein said value of said electrical property comprises a capacitance value.

9. A method as in claim 7, said method deriving step comprises the steps of:

measuring in each of said test structures said electrically measurable quantity;

using a field solver to predict said value of said electrical property based on successively approximated values of said permittivity;

selecting one of said successively approximated values as said value of said permittivity, when said selected value substantially approximates said measured value of said measurable quantity.

10. A method for determining a range of values for a permittivity of an intralayer dielectric layer in a process for manufacturing an integrated circuit substrate, said method comprising the steps of:

fabricating a set of test structures using said manufacturing process, each test structure being different from another one of said structures in a value of an interconnect design parameter, each test structure providing a measurable value of an electrical property, corresponding to a value of said permittivity;

measuring in each of said test structures said measurable value of said electrical property; and deriving from said value of said electrical property said value of said permittivity.

11. A method as in claim 10, said method deriving step comprises the steps of:

using a field solver to predict said value of said electrical property based on successively approximated values of said permittivity;

selecting one of said successively approximated values as said value of said permittivity, when said selected value substantially approximates said measured value of said measurable quantity.

12. A method as in claim 10, wherein said value of said electrical property comprises a capacitance value.

13. A method as in claim 10, wherein said value of said interconnect design parameter being a width of a conductor in said interconnect layer.

14. A method as in claim 10, wherein said value of said interconnect design parameter being a spacing between two conductors in said interconnect layer.

15. A method as in claim 1, wherein one of said test structures comprises parallel lines of a material spaced apart by a known distance; and wherein said method further comprises the steps of:

preparing a cross section of said test structure including a cross section of said parallel lines;

taking a first photomicrograph of said cross section of said test structure at a selected magnification and along a selected orientation of said test structure;

taking a second photomicrograph of said cross section of said test structure at said selected magnification and at a second orientation orthogonal to said selected orientation; and measuring features in said first photomicrograph using said known distance and an image of said parallel lines in said second photomicrograph as a ruler for measuring dimensions in said first photomicrograph along said second orientation.

16. A method as in claim 10, wherein said conductor pattern comprises an array of conductors spaced a predetermined distance from each other.

17. A method as in claim 10, wherein said conductor pattern comprises an array of conductors each having a predetermined width.

18. A method as in claim 10, wherein said quantity comprises a capacitance.

19. A method as in claim 10, wherein said conductor pattern and said plurality of test structures are fabricated on a substrate, said plurality of test structures being placed along one axis said substrate.

* * * * *